United States Patent
Gurlahosur et al.

(10) Patent No.: US 11,545,939 B2
(45) Date of Patent: Jan. 3, 2023

(54) METHODS, APPARATUS, AND SYSTEMS TO ADJUST TRANSIENT RESPONSE IN A MULTISTAGE SYSTEM

(71) Applicant: TEXAS INSTRUMENTS INCORPORATED, Dallas, TX (US)

(72) Inventors: Sanjay Gurlahosur, Campbell, CA (US); Karen Chan, South San Francisco, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 384 days.

(21) Appl. No.: 16/732,235

(22) Filed: Dec. 31, 2019

(65) Prior Publication Data

US 2020/0266769 A1   Aug. 20, 2020

Related U.S. Application Data

(60) Provisional application No. 62/955,581, filed on Dec. 31, 2019, provisional application No. 62/808,143, filed on Feb. 20, 2019.

(51) Int. Cl.
   *H03F 1/30*  (2006.01)
   *H02M 3/335*  (2006.01)
   *H02M 3/156*  (2006.01)

(52) U.S. Cl.
   CPC .............. *H03F 1/30* (2013.01); *H02M 3/156* (2013.01); *H02M 3/33507* (2013.01)

(58) Field of Classification Search
   CPC .... H03F 1/30; H03F 2200/351; H03F 3/2173; H02M 3/156; H02M 3/33507; H02M 3/1584
   USPC ... 330/298, 136, 296–297, 207 P, 10, 207 A, 330/251
   See application file for complete search history.

(56) References Cited

U.S. PATENT DOCUMENTS

2017/0331370 A1*  11/2017  Arbetter ................. H02M 1/08

* cited by examiner

*Primary Examiner* — Samuel S Outten
*Assistant Examiner* — Khiem D Nguyen
(74) *Attorney, Agent, or Firm* — Charles F. Koch; Frank D. Cimino

(57) ABSTRACT

Methods, apparatus, and systems are disclosed that adjust transient response in a multistage system. An example apparatus includes a first filter including an input configured to be coupled to an output of a master stage, an amplifier, the first input of the amplifier coupled to the input of the first filter, the second input of the amplifier coupled to the output of the first filter, a second filter, the input of the second filter coupled to the output of the amplifier, and a comparator, the first input of the comparator coupled to the input of the first filter circuit, the second input of the comparator coupled to the output of the amplifier, the third input of the comparator coupled to the output of the second filter, and the output of the comparator adapted to be coupled to a latch.

20 Claims, 11 Drawing Sheets

METHODS, APPARATUS, AND SYSTEMS TO ADJUST TRANSIENT RESPONSE IN A MULTISTAGE SYSTEM

RELATED APPLICATION

This patent claims the benefit of and priority to U.S. Provisional Patent Application Ser. No. 62/808,143 filed Feb. 20, 2019, which is hereby incorporated herein by reference in its entirety, and U.S. Provisional Patent Application Ser. No. 62/955,581 filed Dec. 31, 2019, which is hereby incorporated herein by reference in its entirety.

FIELD OF THE DISCLOSURE

This disclosure relates generally to multistage systems and, more particularly, to methods, apparatus, and systems to adjust transient response in a multistage system.

BACKGROUND

Power converters, power supply systems, and/or various power electronic devices (such as buck converters or buck-boost converters) operate in response to a pulse width modulated (PWM) signal generated. Some power converters, power supply systems, and/or various power electronic device applications operate in response to multiple PWM signals generated by multiple PWM signal generators generated by multiple stages, each of which generates a PWM signal.

DETAILED DESCRIPTION

Figure 1:
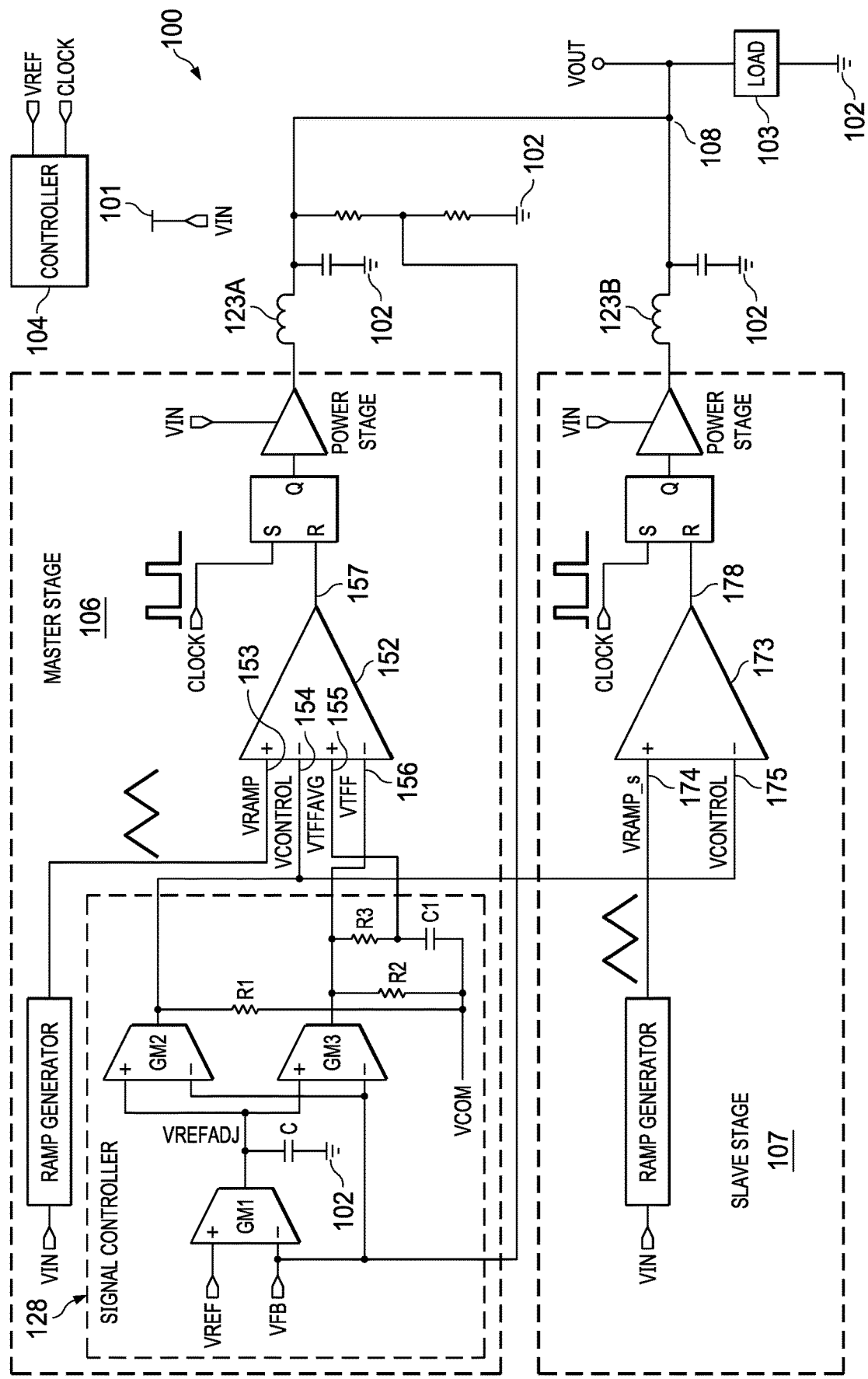
FIG. 1 is a schematic illustration of an implementation of a power conversion system to power a load.

The figures are not to scale. In general, the same reference numbers will be used throughout the drawings and accompanying written description to refer to the same or like parts. As used herein, connection references (e.g., attached, coupled, connected, and joined) are to be construed in light of the specification and, when pertinent, the surrounding claim language. Construction of connection references in the present application shall be consistent with the claim language and the context of the specification which describes the purpose for which various elements are connected. As such, connection references do not necessarily infer that two elements are directly connected and in fixed relation to each other.

Descriptors first, second, third, etc. are used herein when identifying multiple elements or components that may be referred to separately. Unless otherwise specified or understood based on their context of use, such descriptors are not intended to impute any meaning of priority, physical order, or arrangement in a list, or ordering in time but are merely used as labels for referring to multiple elements or components separately for ease of understanding the disclosed examples. In some examples, the descriptor first may be used to refer to an element in the detailed description, while the same element may be referred to in a claim with a different descriptor such as "second" or "third." In such instances, it should be understood that such descriptors are used merely for ease of referencing multiple elements or components.

Power conversion systems, power converters, and/or suitable power electronic devices utilize control circuitry and a number of switches (e.g., transistors) that are responsive to a PWM signal generated by a PWM generator (e.g., a latch circuit or a flip-flop). The PWM generator may vary the PWM signal responsive to an amplifier output signal. For example, a comparator circuit may monitor a ramp signal provided by a ramp generator, compare the ramp signal voltage to a control signal voltage, and generate an amplifier output signal responsive to a comparison of the voltages exceeding a threshold. The PWM generator may reset the PWM signal responsive to a variation of the amplifier output signal obtained at a reset input terminal. In some examples, the comparator circuit may monitor more than two control voltage signals generated by the power converter, such as a ramp signal, a feedback voltage signal, an average feed-forward signal, and/or a feed-forward signal, to generate the amplifier output signal.

Power conversion systems (e.g., power converters) may react quickly to sudden changes in a load so that the output signal remains regulated or normalized. As used herein, the phrases "transient load," "load transients," and variations thereof, encompass a change in the characteristics of one or more loads coupled to an output node of the power conversion system (e.g., power converter) over time, such as a sudden connection of a load or a disconnection of a load from the power conversion system. For example, a load transient may encompass a time period during which a second load is connected in parallel to a first load, thereby changing the current a power conversion system must source. The power converter regulates (e.g., normalizes, adjusts, modifies, varies) the output signal responsive to a variation in the load. As used herein, the phrase "to regulate," and variations thereof, encompasses generating and/or modifying a signal such that the signal does not exceed and/or fall below a threshold. For example, a power conversion system may regulate an output signal such that the output signal does not fall below a threshold. In one example, the power converter may regulate (e.g., increase) an output current signal responsive to a decrease in a voltage signal (e.g., a feedback signal), the voltage signal based on the output current signal.

In some examples, the power converter may regulate the output signal based on signals generated using the output signal, such as a feedback signal and/or a feed-forward signal. For example, the power converter may provide an output current signal to a load, and a transient load occurs. As a result, a voltage signal (e.g., a voltage at a node adapted to be coupled to the load) may vary. Responsive to a variation in feedback and/or feed-forward signals generated from the voltage signal, the power converter varies (e.g., increases) the output current signal. Thus, the transient load response of the power converter may include an increase in the output current signal. As used herein, the phrase "transient load response," and variations thereof, encompass a variation of the output signal by the power conversion system in response to a transient load.

A power electronic device such as a multistage switching mode power supply (SMPS) system may include a master stage and a slave stage. The master stage (e.g., a master device and/or a master phase) may generate a first PWM signal based on a reference signal and/or a feedback signal, and the slave stage (e.g., a slave device and/or a slave phase) may generate a second PWM signal based on a control signal obtained from the master stage. The feedback signal may be an output signal generated by the SMPS system, and the feedback signal may be filtered (e.g., via a low pass filter circuit and/or a transconductance amplifier) by the master stage of the SMPS system. The master stage may generate feed-forward signals based on the reference signal and/or the feedback signal. The slave stage may generate feed-forward signals based on a control signal obtained from the master stage. The master stage monitors the feedback signal and/or the reference signal, and the master stage varies a control signal to be monitored by a comparator circuit of the master stage and/or a comparator circuit of the slave stage.

The comparator circuit of the master stage may provide an amplifier output signal to a PWM generator to stabilize the output signal of the SMPS system in response to transient load conditions. For example, during load transients in the power converter, the control signal is varied by the master stage, and the comparator circuit of the master stage varies an amplifier output signal responsive to the control signal and/or other signals (such as a ramp signal, a feed-forward signal, and/or an average feed-forward signal) to vary the PWM signal generated by a latch circuit in the master stage. The comparator circuit of the slave stage may then vary an amplifier output signal responsive to the control signal and/or other signals (such as a ramp signal, a feed-forward signal, and an average feed-forward signal) to vary the PWM signal generated by a latch circuit in the slave stage. Thus, the master stage and the slave stage regulate the output signal of the SMPS system.

In some examples, SMPS connections may introduce restrictions on stages of the SMPS system and/or a suitable electronic power device. For example, a slave stage on an SMPS system may not have available pins to provide connections, and, accordingly, the slave stage is unable to be coupled to multiple control signals generated by the master stage, such as a feed-forward signal. For example, if a master stage generates a control signal, a feed-forward signal, and an average feed-forward signal in order to generate a PWM signal, the slave stage may only be adapted to receive the control signal and not be adapted to receive the feed-forward signal or the average feed-forward signal. Amplification and/or a filtering of the control signal obtained by the slave stage may enable a faster and more efficient regulation of the output of the SMPS system.

In some examples, an SMPS system may react to sudden changes in a load and/or a load transient such that the regulated output signal does not sag, fall outside of an expected range, exceed a threshold, fall below a threshold, etc. In some examples, an output capacitance of the SMPS system may be increased to limit a sag in an output signal responsive to a load transient. However, an increase in output capacitance may increase an area of the SMPS system, leading to an increase in manufacturing costs. In some examples discussed herein, an SMPS system may include a feed-forward path to enable a rapid transient load response without increasing the area of the SMPS system and/or without a cost to increase the output capacitance. In a single phase SMPS system, the SMPS system may use the feedback and/or feed-forward signal(s) to increase a duty cycle of the PWM generator such that the output signal is amplified (e.g., more power is provided to the load during the transient response). However, when multiple SMPS phases are stacked together in a multiphase configuration to provide more power to the load (e.g., the SMPS system includes a master stage and a slave stage), the slave stage may not include connections to obtain feedback and/or feed-forward signals from the master stage. As a result, the output signal generated by the slave stage may lag (e.g., respond slower than) the output signal generated by the master stage, and the signal provided to the load may sag (e.g., decrease). Some examples discussed herein illustrate a method to include a feed-forward path (such as a signal) for devices (such as slave devices, slave phases, slave stages, etc.) included in a stacked SMPS system.

FIG. 1 is a schematic illustration of a power conversion system 100 to power a load. The power conversion system 100 includes a source voltage node (VIN) 101, a ground reference rail 102, a load 103, a controller 104, a master stage 106, and a slave stage 107. The power conversion system 100 regulates an output voltage signal (VOUT) at an output node 108 responsive to load transients. The master stage 106 responds to variations in a reference signal (VREF) and a feedback voltage signal (VFB) to provide an output signal to the load 103 at the output node 108. Similarly, the slave stage 107 responds to variations in a control signal (VCONTOL) to provide an output signal to the load 103.

The master stage 106 and the slave stage 107 include ramp generator circuits. The ramp generator circuit of the master stage 106 generates a ramp voltage signal (VRAMP), and the ramp generator circuit of the slave stage 107 generates a ramp voltage signal (VRAMP_s). The ramp generator circuits generate periodic inverse sawtooth waveforms.

The master stage 106 and the slave stage 107 include latch circuits that generate latch signals (i.e., PWM signals) to be converted into corresponding power signals. The latch circuits vary latch output voltage signals responsive to variations in voltage at a set input terminal and in voltage at a reset input terminal. The master stage 106 and the slave stage 107 include power stage circuits. Each power stage circuit generates a power stage output signal responsive to signals provided by the latch signals. Thus, the power conversion system 100 provides power to the load 103.

The power conversion system 100 includes inductors 123A, 123B coupled between the stages 106, 107 and the output node 108. The master stage 106 further includes a signal controller 128. The signal controller 128 is responsive to the reference signal (VREF) and the feedback voltage signal (VFB) to generate the control signal (VCONTROL), a feed-forward signal (VTFF), and an average feed-forward signal (VTFFAVG).

The master stage 106 further includes a first comparator circuit 152. The first comparator circuit 152 includes a first non-inverting input terminal 153, a second non-inverting input terminal 155, a second inverting input terminal 156, and an output terminal 157. The first comparator circuit 152 varies an output voltage signal responsive to a comparison of a voltages. The first comparator circuit 152 The first comparator circuit 152 varies the duty cycle of the latch circuit of the master stage 106, the variation responsive to the comparison, by varying the voltage at a reset terminal of the latch circuit.

In the example of FIG. 1, the master stage 106 varies the voltage of the control signal (VCONTROL), and the slave stage 107 varies an output signal provided at the output node 108 responsive to variations in the control signal.

The slave stage 107 further includes a second comparator circuit 173. The second comparator circuit 173 includes a non-inverting input terminal 174, an inverting input terminal 175, and an output terminal 178. The second comparator circuit 173 varies an output voltage responsive to variations in the signal VRAMP_s and the signal VCONTROL. In the example of FIG. 1, the slave stage 107 may lag and/or may not compensate for load transients with the master stage. For example, the slave stage 107 may be slower to respond to a load transient than the master stage 106 that generates the feed-forward signal and/or the average feed-forward signal. In the example of FIG. 1, the slave stage 107 may not amplify and/or filter the control signal (VCONTROL). Thus, the slave stage 107 does not generate a filtered control signal, a feed-forward signal, or an average feed-forward signal based on the control signal generated by the signal controller 128.

Figure 2A:
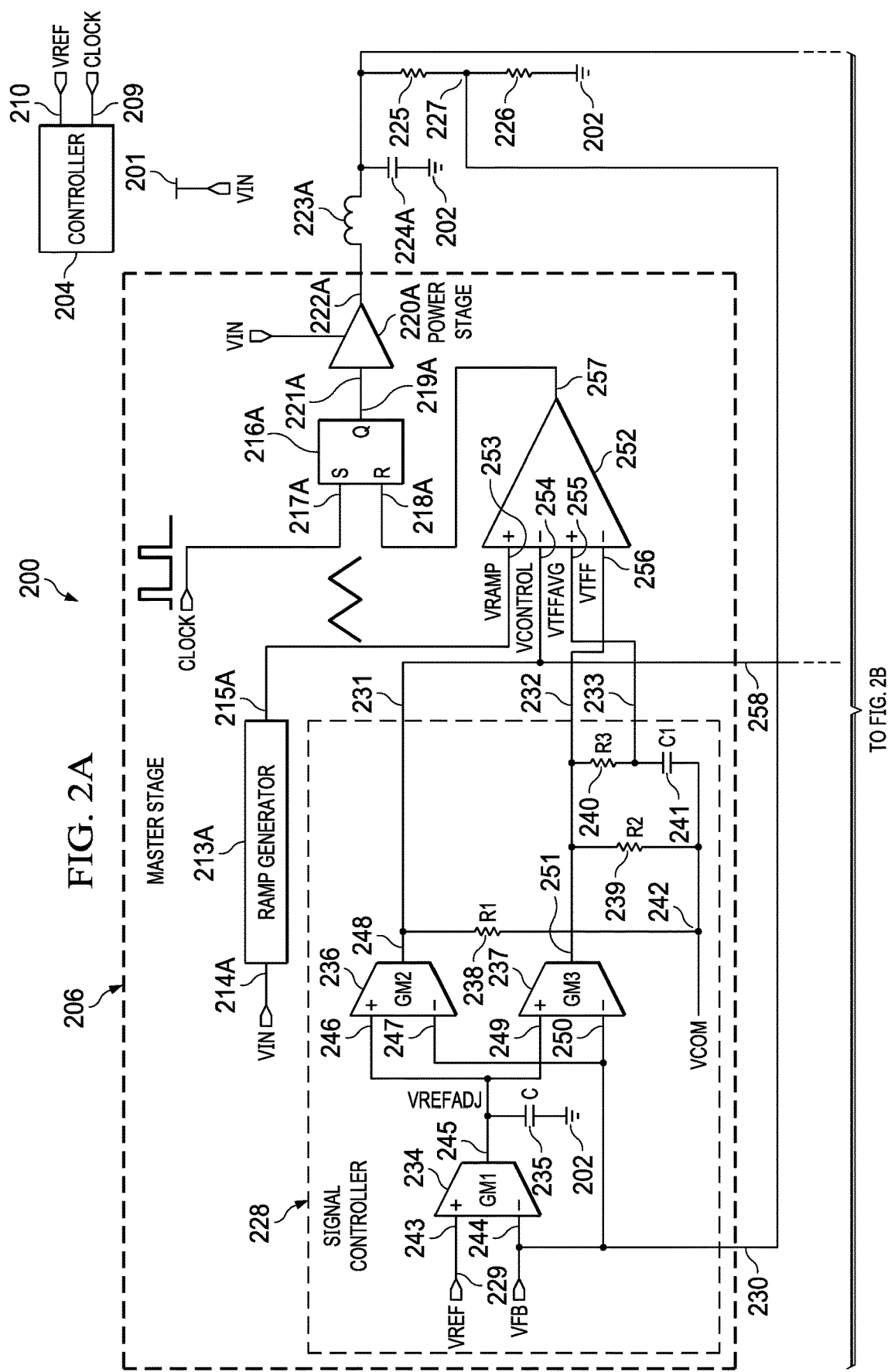
FIGS. 2A and 2B, collectively FIG. 2, form a schematic illustration of an example described power conversion system to power an example load.
Figure 2B:
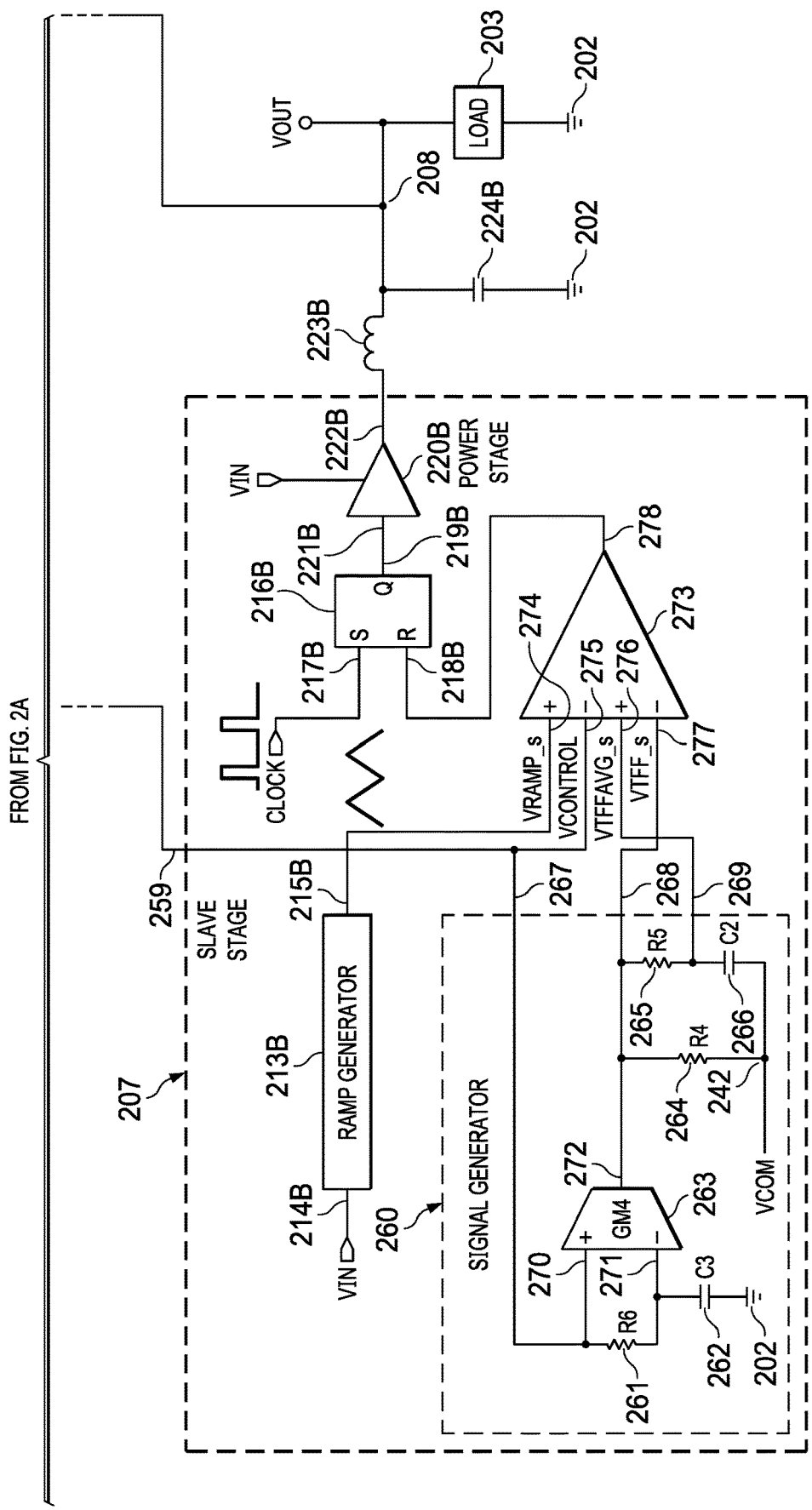

FIGS. 2A and 2B, collectively FIG. 2, form a schematic illustration of an example described power conversion system 200 to power an example load. The example power conversion system 200 is adapted to be coupled to a source voltage node (VIN) 201, a ground reference rail 202, a load 203, and a controller 204. The power conversion system 200 is adapted to drive (e.g., power and/or provide an output signal to) the load 203. For example, the load 203 can correspond to an electric vehicle, one or more batteries in the electric vehicle, an electric motor in the electric vehicle, a traction inverter included in the electric vehicle, etc. The power conversion system 200 includes a master stage 206, and a slave stage 207. The power conversion system 200 regulates an output signal (e.g., a voltage signal VOUT, a current signal) at an output node 208 responsive to load transients. Any number of loads may be coupled to the power conversion system 200. For example, the power conversion system 200 may respond to a transient load (such as when a second load is coupled in parallel to the load 203).

In the example of FIG. 2, the power conversion system 200 includes one master stage (e.g., the master stage 206, a master device, a master phase, a first power stage, etc.) and one slave stage (e.g., the slave stage 207, a slave device, a master phase, a second power stage, etc.). However, any number of stages may additionally or alternatively be included in the power conversion system 200. For example, the power conversion system 200 may include one master stage and ten slave stages. Each stage may be coupled to the output node 208 (e.g., a node coupled to each stage and to the load 203) to regulate the output signal (e.g., the voltage signal VOUT). In some examples, the master stage 206 and the slave stage(s) respond together to load transients to regulate the output signal. The master stage 206 may control the slave stage(s) using a control signal. For example, the master stage 206 may vary the control signal responsive to load transients, and the slave stage(s) respond to the variation in the control signal. The master stage 206 may provide the control signal to regulate (e.g., vary) an output (e.g., power, a current signal) provided by the master stage 206 and/or the slave stage 207. For example, the master stage 206 and/or the slave stage 207 may vary (such as increase) an output power current provided to the load 203 responsive a variation (such as an increase) in the control signal.

In one example, the controller 204 includes a first output terminal 209 and a second output terminal 210. In the example of FIG. 2, the controller 204 includes clock generation circuitry to generate a clocking signal (CLOCK) at the first output terminal 209 and control circuitry to generate reference signal (VREF) at the second output terminal 210.

The master stage 206 responds to variations in the reference signal. The reference signal may be a reference voltage or a set point for the power conversion system 200 (e.g., the master stage 206) to monitor and to which the power conversion system 200 responds. For example, the controller 204 may increase the voltage of the signal VREF, and the master stage 206 may respond by increasing an output signal at the output node 208. Further, any other output signals generated by the controller 204 may additionally and/or alternatively be included. For example, the controller 204 may generate one or more ramp signals.

In the example of FIG. 2, the master stage 206 and the slave stage 207 include ramp generator circuits 213A, 213B. Each ramp generator circuit 213A, 213B includes an input terminal 214A, 214B coupled to the source voltage node 201 and an output terminal 215A, 215B. The ramp generator circuit 213A of the master stage 206 generates a ramp signal (e.g., a ramp voltage signal VRAMP) at the output terminal 215A. The ramp generator circuit 213B of the slave stage 207 generates a ramp signal (e.g., a ramp voltage signal VRAMP_s) at the output terminal 215B.

In some examples discussed herein, the ramp generator circuits 213A, 213B generate periodic inverse sawtooth waveforms. However, any other waveform (such as a sawtooth waveform, triangle waveform, square waveform, or sinusoidal waveform) or any other signal may be generated by the ramp generator circuits 213A, 213B at the output terminals 215A, 215B. While in the illustrated example of FIG. 2 the master stage 206 and the slave stage 207 include ramp generator circuits 213A, 213B, any other methods to generate the ramp signal of the master stage 206 or the ramp signal of the slave stage 207 may additionally or alternatively be used. The power conversion system 200 may include one ramp generator circuit shared by the master stage 206 and the slave stage 207. For example, the controller 204 may include one or more ramp generator circuits to provide the signal VRAMP to the master stage 206 and the signal VRAMP_s to the slave stage 207. In one example, the input terminal 214B of the ramp generator circuit 213B may be coupled to the output terminal 215A of the ramp generator circuit 213A.

The master stage 206 and the slave stage 207 include latch circuits 216A, 216B that generate latch signals (e.g., PWM signals) to be converted into power stage output signals. In the example illustrated in FIG. 2, the latch circuits 216A, 216B are implemented as flip-flop circuits (such as flip-flops or latches). However, any other implementation of the latch circuits 216A, 216B may additionally or alternatively be used to generate the latch signals.

The latch circuits 216A, 216B include set input terminals 217A, 217B, a reset input terminal 218A, 218B, and a Q output terminal 219A, 219B (e.g., a Q output terminal). In some examples described herein, the set input terminals 217A, 217B are coupled to the first output terminal 209 of the controller 204 and receive a clock signal (e.g., the signal CLOCK) therefrom. However, any other circuitry may additionally or alternatively be coupled to the set input terminal 217A, 217B to respond to variations in the voltage at the set input terminal 217A, 217B.

The latch circuits 216A, 216B vary the voltage at the Q output terminals 219A, 219B responsive to variations in the voltage at the set input terminals 217A, 217B and variations in the voltage at the reset input terminals 218A, 218B. When the voltage at the set input terminal 217A, 217B is a logic low and the voltage at the reset input terminal 218A, 218B is a logic low, the latch circuit 216A, 216B responds by maintaining the voltage at the Q output terminal 219A, 219B. When the voltage at the set input terminal 217A, 217B is a logic low and the voltage at the reset input terminal 218A, 218B is a logic high, the latch circuit 216A, 216B responds by resetting the voltage at the Q output terminal 219A, 219B to a logic low. When the voltage at the set input terminal 217A, 217B is a logic high and the voltage at the reset input terminal 218A, 218B is a logic low, the latch circuit 216A, 216B responds by setting the voltage at the Q output terminal 219A, 219B to a logic high. When the voltage at the set input terminal 217A, 217B is a logic high and the voltage at the reset input terminal 218A, 218B is a logic high, the latch circuit 216A, 216B may respond by setting the voltage at the Q output terminal 219A, 219B to a logic low or to a logic high. However, the latch circuits 216A, 216B may vary the voltage at the Q output terminal 219A, 219B according to any method. For example, the latch circuit 216A, 216B may reset the voltage at the Q output terminal 219A, 219B to a logic low when the voltage at the reset input terminal 218A, 218B is reset to a logic low.

In some examples described herein, a logic low encompasses a voltage of zero volts, and a logic high encompasses a voltage of five volts. However, a logic low or a logic high may encompass any value or signal. For example, a logic low may encompass a relatively low voltage (e.g., one volt) in comparison to a logic high voltage, and logic high may encompass a relatively higher voltage than the logic low (e.g., two volts).

The master stage 206 and the slave stage 207 include power stage circuits 220A, 220B. In the example of FIG. 2, the power stage circuit 220A includes an input terminal 221A coupled to the Q output terminal 219B of the latch circuit 216A and an output terminal 222A. Similarly, the power stage circuit 220B includes an input terminal 221B coupled to the Q output terminal 219B of the latch circuit 216B and an output terminal 222B. The power stage circuits 220A, 220B are each coupled to the source voltage node 201. The power stage circuits 220A, 220B are adapted to amplify a signal obtained at the input terminals 221A, 221B, such as a PWM signal generated by the latch circuits 216A, 216B. For example, the power stage circuits 220A, 220B may include switches and/or output filters to amplify an input voltage to an output voltage relatively higher than the input voltage. In one example, the power stage circuits 220A, 220B may increase a current provided at the output terminals 222A, 222B responsive to an increase in a voltage obtained at the input terminals 221A, 221B, such as a latch signal.

In the example of FIG. 2, each power stage circuit 220A, 220B generates a power stage output signal at an output terminal 222A, 222B responsive to the latch signal (e.g., a PWM signal) generated by each latch circuit 216A, 216B. The power stage circuits 220A, 220B each respond to the voltage of the Q output terminal 219A, 219B of the latch circuit 216A, 216B by varying (such as raising, lowering, boosting, or bucking) the voltage at the output terminal 222A, 222B of the power stage circuit 220A, 220B. In some examples discussed herein, each power stage circuit 220A, 220B includes control circuitry, driver circuitry, and multiple switches. The control circuitry and driver circuitry activate and deactivate the switches repeatedly to vary the power stage output signal. However, any other methods to implement either power stage circuit 220A, 220B may additionally or alternatively be used.

The example power conversion system 200 includes inductors 223A, 223B and capacitors 224A, 224B. The inductor 223A is coupled to the output terminal 222A, and the inductor 223B is coupled to the output terminal 222B. Each inductor 223A, 223B is coupled to the output node 208, and the load 203 is coupled between the output node 208 and the ground reference rail 202. The output node 208 is the node coupled to the inductors 223A, 223B and to the load 203. The capacitors 224A, 224B are each coupled in parallel between the output node 208 and the ground reference rail 202.

The inductor 223A and the capacitor 224A form a filter circuit to filter the power stage output signal of the power stage circuit 220A to supply a filtered power signal at the output node 208. Similarly, the inductor 223B and the capacitor 224B form a filter circuit to filter the power stage output signal of the power stage circuit 220B to supply a filtered power signal at the output node 208. However, any other method to couple the output terminals 222A, 222B of the power stage circuits 220A, 220B to the output node 208 may additionally or alternatively be used. For example, no capacitors or inductors may be coupled to the output terminals 222A, 222B of the power stage circuits 220A, 220B. In one example, the output terminals 222A, 222B of the power stage circuits 220A, 220B may be coupled to any number of inductors, resistors, or capacitors. In some examples, the filter circuits (such as the filter circuit composed by the inductor 223A and the capacitor 224A or the filter circuit composed by the inductor 223B and the capacitor 224B) may be low pass filter circuits. In some examples, the filter circuits may be adapted to supply a filtered power signal to the load 203.

The power conversion system 200 includes a first resistor 225 coupled in series with a second resistor 226. The first resistor 225 is coupled to the output node 208. The second resistor 226 is coupled between the first resistor 225 and the ground reference rail 202. In the illustrated example of FIG. 2, the first resistor 225 and the second resistor 226 divide the output signal (such as the signal VOUT) generated at the output node 208 to generate a feedback voltage signal (such as a voltage signal VFB) at node 227. However, any other method to generate the signal VFB may additionally or alternatively be used. For example, the signal VFB may be generated using a resistor and a diode.

The master stage 206 includes a signal controller 228. The signal controller 228 includes a first input terminal 229, a second input terminal 230, a first output terminal 231, a second output terminal 232, and a third output terminal 233. The first input terminal 229 is coupled to the second output terminal 210, and the second input terminal 230 is coupled to the first resistor 225 and the second resistor 226 at node 227.

The signal controller 228 is responsive to a signal at the first input terminal 229 (e.g., the signal VREF) and a signal at the second input terminal 230 (e.g., the signal VFB). The signal controller 228 generates a control signal (e.g., a voltage signal VCONTROL) at the first output terminal 231, a feed-forward signal (e.g., a voltage signal VTFF) at the second output terminal 232, and an average feed-forward signal (e.g., a voltage signal VTFFAVG) at the third output terminal 233. The signal controller 228 generates the signal VCONTROL and the signal VTFF proportionally to the signal VREF and the signal VFB. The signal controller 228 generates the signal VTFFAVG by filtering the signal VTFF. In some examples, the signal VTFFAVG may be an average of the voltage of the signal VTFF over a period of time.

In the example illustrated in FIG. 2, the signal controller 228 is implemented as a proportional-integral controller. In other words, the signal VCONTROL generated at the first output terminal 231 and signal VTFF generated at the second output terminal 232 are proportional to the signal VREF generated at the first input terminal 229 and the signal VFB generated at the second input terminal 230, respectively. Further, the signal VTFFAVG generated at the third output terminal 233 is integral to the signal VREF generated at the first input terminal 229 and the signal VFB generated at second input terminal 230. However, any methods to implement the signal controller 228 may additionally or alternatively be used. For example, the signal controller 228 may be a proportional controller or a proportional-derivative-integral controller.

The signal controller 228 includes a first amplifier (GM1) 234, a second capacitor (C) 235, a second amplifier (GM2) 236, a third amplifier (GM3) 237, a third resistor (R1) 238, a fourth resistor (R2) 239, a fifth resistor (R3) 240, a third capacitor (C1) 241, and a common voltage node 242. The common voltage node 242 may be coupled to any suitable source voltage node (VCOM). For example, the common voltage node 242 may be coupled to the ground reference rail 202 or to the source voltage node 201.

The first amplifier 234 includes a non-inverting input terminal 243 coupled to the first input terminal 229, an inverting input terminal 244 coupled to the second input terminal 230, and an output terminal 245. The second capacitor 235 is coupled between the output terminal 245 and the ground reference rail 202. The first amplifier 234 integrates the difference between the signal VREF at the non-inverting input terminal 243 and the signal VFB at the inverting input terminal 244 to generate a voltage signal VREFADJ. The signal VREFADJ is generated by comparing (e.g., amplifying) the signal VFB (e.g., the voltage at the second input terminal 230) to the signal VREF (e.g., the voltage at the first input terminal 229).

The second amplifier 236 includes a non-inverting input terminal 246 coupled to the output terminal 245 of the first amplifier 234, an inverting input terminal 247 coupled to the second input terminal 230 of the signal controller 228, and an output terminal 248 coupled to the first output terminal 231 of the signal controller 228. The third resistor 238 is coupled between the output terminal 248 of the second amplifier 236 and the common voltage node 242. The second amplifier 236 generates a control signal (e.g., a voltage signal VCONTROL) at the output terminal 248 proportional to a difference between the signal at the non-inverting input terminal 246 (e.g., the voltage of the signal VREFADJ) and the signal at the inverting input terminal 247 (e.g., the voltage of the signal VFB). In the example illustrated in FIG. 2, the signal VCONTROL generated by the second amplifier 236 is a proportional component of the proportional-integral controller (such as the signal controller 228).

An example formula to calculate the voltage of the signal VCONTROL is shown below in Equation 1:

$$\text{VCONTROL} = \text{VCOM} + (GM2 * R1)(\text{VREFADJ} - \textit{VFB}) \quad \text{Equation 1}$$

In the example of Equation 1, VCONTROL represents the voltage of the signal VCONTROL, VCOM represents the voltage of the common voltage node 242, GM2 represents the transconductance characteristic of the second amplifier 236, R1 represents the ohmic resistance of the third resistor 238, VREFADJ represents the voltage of the signal VREFADJ, and VFB represents the voltage of the signal VFB. An example formula for a gain generated by the second amplifier 236 is shown below in Equation 2:

$$\text{GAIN2} = GM2 * R1 \quad \text{Equation 2}$$

In the example of Equation 2, GAIN2 represents the gain generated by the second amplifier 236 at the output terminal, GM2 represents the transconductance characteristic of the second amplifier 236, and R1 represents the ohmic resistance of the third resistor 238.

The third amplifier 237 includes a non-inverting input terminal 249 coupled to the output terminal 245 of the first amplifier 234, an inverting input terminal 250 coupled to the second input terminal 230 of the signal controller 228, and an output terminal 251 coupled to the second output terminal 232 of the signal controller 228. The fourth resistor 239 is coupled between the output terminal 251 of the third amplifier 237 and the common voltage node 242. The third amplifier 237 generates a feed-forward signal (e.g., a voltage signal VTFF) at the output terminal 251 proportional to a difference between the voltage of the signal VREFADJ at the non-inverting input terminal 249 and the voltage of the signal VFB at the inverting input terminal 250. In the example illustrated in FIG. 2, the signal VTFF generated by the third amplifier 237 at the output terminal 251 is a feed-forward component of the proportional-integral controller (such as the signal controller 228).

An example formula to calculate the voltage of the signal VTFF is shown below in Equation 3:

$$\text{VTFF} = \text{VCOM} + (GM3 * R2)(\text{VREFADJ} - \textit{VFB}) \quad \text{Equation 3}$$

In the example of Equation 3, VTFF represents the voltage of the signal VTFF, VCOM represents the voltage of the common voltage node 242, GM3 represents the transconductance characteristic of the third amplifier 237, R2 represents the ohmic resistance of the fourth resistor 239, VREFADJ represents the voltage of the signal VREFADJ, and VFB represents the voltage of the signal VFB.

An example formula for a gain generated by the third amplifier 237 is shown below in Equation 4:

$$\text{GAIN3} = GM3 * R2 \quad \text{Equation 4}$$

In the example of Equation 4, GAIN3 represents the gain generated by the third amplifier 237 at the output terminal, GM3 represents the transconductance characteristic of the third amplifier 237, and R2 represents the ohmic resistance of the fourth resistor 239.

The output terminal 251 of the third amplifier 237 is coupled to the fifth resistor 240. The third capacitor 241 is coupled between the fifth resistor 240 and the common voltage node 242. The fifth resistor 240 and the third capacitor 241 are coupled to the third output terminal 233 of the signal controller 228. In the example of FIG. 2, the fourth resistor 239, the fifth resistor 240, and the third capacitor 241 form a filter circuit to generate an average feed-forward signal (such as a voltage signal VTFFAVG) from the voltage at the output terminal 251 of the third amplifier 237. In some examples, the filter circuit is a low pass filter circuit, and the signal VTFFAVG is generated by the filter circuit such that a large difference between the voltage of the signal VTFF and the voltage of the signal VTFFAVG may increase the duty cycle of a signal at the reset input terminal 218A of the latch circuit 216A during a load transient response.

The master stage 206 includes a first PWM comparator (e.g., a first comparator circuit 252). In some examples described herein, the first PWM comparator (e.g., the first comparator circuit 252) is implemented as a dual differential amplifier. However, any other method to implement the first comparator circuit 252 may additionally or alternatively be used. The first comparator circuit 252 includes a first non-inverting input terminal 253 coupled to the output terminal 215A of the ramp generator circuit 213A, a first inverting input terminal 254 coupled to the first output terminal 231 of the signal controller 228, a second non-inverting input terminal 255 coupled to the third output terminal 233 of the signal controller 228, a second inverting input terminal 256 coupled to the second output terminal 232 of the signal controller 228, and an output terminal 257 coupled to the reset input terminal 218A of the latch circuit 216A.

The first comparator circuit 252 varies an amplifier output signal (e.g., a voltage signal) at the output terminal 257 responsive to a comparison of a signal at the first non-inverting input terminal 253 (such as the signal VRAMP), a signal at the first inverting input terminal 254 (such as the signal VCONTROL), a signal at the second non-inverting input terminal 255 (such as the signal VTFFVG), a signal at the second inverting input terminal 256 (such as the signal VTFF), and a threshold (such as zero volts, four volts). In some examples, the generation of the amplifier output signal responsive to inputs at the input terminals 253, 254, 255, 256 may result in error amplification. In some examples, the first comparator circuit 252 varies the duty cycle of the latch circuit 216A, the variation responsive to the comparison, by varying the voltage at the reset input terminal 218A. The variation of the voltage at the reset input terminal 218A resets the latch circuit 216A. The first PWM comparator (e.g., the first comparator circuit 252) is adapted to output an amplifier signal at the output terminal 257.

An example condition of when the first PWM comparator (e.g., the first comparator circuit 252) may reset the latch circuit 216A is shown below in Equation 5:

$$(VRAMP-VCONTROL)+(VTFFAVG-VTFF)=0 \quad \text{Equation 5}$$

In the example of Equation 5, VRAMP represents the voltage of the signal VRAMP generated at the output terminal 215A of the ramp generator circuit 213A, VCONTROL represents the voltage of the signal VCONTROL generated at the first output terminal 231 of the signal controller 228, VTFFAVG represents the voltage of the signal VTFFAVG generated at the third output terminal 233 of the signal controller 228, and VTFF represents the voltage of the signal VTFF generated at the second output terminal 232 of the signal controller 228. In the example illustrated in FIG. 2 and in Equation 5, the first comparator circuit 252 resets the latch circuit 216A when Equation 5 is met (such as when a sum of the voltages at the input terminals 253, 254, 255, 256 to the first comparator circuit 252 equals zero, or a comparison of the voltages at the input terminals 253, 254, 255, 256 and a threshold of zero volts is met). However, the first PWM comparator (e.g., the first comparator circuit 252) may reset the latch circuit 216A responsive to any alternative or additional conditions. For example, the first comparator circuit 252 may reset the latch circuit 216A when a comparison of the voltages at the input terminals 253, 254, 255, 256 exceeds a threshold (such as a voltage threshold of five volts).

When the load 203 is in a steady state (e.g., there is no load transient), the voltage of the signal VTFFAVG and the voltage of the signal VTFF may be similar. As a result, the first comparator circuit 252 will vary the voltage at the output terminal 257 of the first comparator circuit 252 responsive to when a comparison of the voltage of the signal VCONTROL and the voltage of the signal VRAMP meets the threshold (e.g., a voltage threshold of zero volts). During a load transient, the voltage of the signal VTFF increases, and the voltage of the signal VTFFAVG remains the same. As a result, a difference (VTFFAVG-VTFF) is negative, and the first comparator circuit 252 responds to a comparison of a higher voltage of the signal VRAMP.

The master stage 206 includes an output terminal 258 coupled to the first output terminal 231 of the signal controller 228, and the slave stage 207 includes an input terminal 259 coupled to the output terminal 258 of the master stage 206. The master stage 206 varies the voltage of the signal VCONTROL at the output terminal 258 to control the output signal of the slave stage 207. Further, the slave stage 207 amplifies and/or filters the signal VCONTROL provided by the master stage 206 to regulate the signal generated at the output node 208 of the power conversion system 200. In the example illustrated in FIG. 2, the master stage 206 includes one output terminal coupled to one input terminal included in the slave stage 207. However, any number of input terminals or output terminals may be included by the master stage 206 or the slave stage 207.

The slave stage 207 includes a signal generator 260 including a sixth resistor (R6) 261, a fourth capacitor (C3) 262, a fourth amplifier (GM4) 263, a seventh resistor (R4) 264, an eighth resistor (R5) 265, and a fifth capacitor (C2) 266. The signal generator 260 includes an input terminal 267 coupled to the input terminal 259 of the slave stage 207, a first output terminal 268, and a second output terminal 269. The signal generator 260 generates a feed-forward signal (e.g., a voltage signal VTFF_s) at a first output terminal 268, and an average feed-forward signal (e.g., a voltage signal VTFFAVG_s) at a second output terminal 269 based on the control signal (e.g., the signal VCONTROL) obtained at the input terminal 259 of the slave stage 207. In the example illustrated in FIG. 2, the signal generator 260 generates the feed-forward signal (VTFF_s) and average feed-forward signal (VTFFAVG_s). As a result, the slave stage 107 may respond to load transients by responding to variations in the signal VTFF_s and/or the signal VTFFAVG_s.

The fourth amplifier 263 includes a non-inverting input terminal 270, an inverting input terminal 271, and an output terminal 272. In the example illustrated in FIG. 2, the fourth amplifier 263 is implemented as a transconductance amplifier circuit. However, any other methods to implement the fourth amplifier 263 may additionally or alternatively be used. For example, the fourth amplifier 263 may be implemented as an operational amplifier.

The non-inverting input terminal 270 of the fourth amplifier 263 is coupled to the input terminal 267 (e.g., input terminal 259 of the slave stage 207). In some examples, the non-inverting input terminal 270 and/or the filter circuit including the sixth resistor 261 and the fourth capacitor 262 may be configured to be coupled to an output of the master stage, such as the output terminal 258. The sixth resistor 261 is coupled between the input terminal 259 of the slave stage 207 and to the inverting input terminal 271 of the fourth amplifier 263. The fourth capacitor 262 is coupled between the inverting input terminal 271 and the ground reference rail 202. The sixth resistor 261 and the fourth capacitor 262 form a filter circuit configured to obtain the control signal (e.g., the signal VCONTROL) and to generate a filtered control signal at the inverting input terminal 271. In some examples, the fourth amplifier 263 may receive the control signal VCONTROL and the filtered control signal to generate a feed-forward signal VTFF_s based on the control signal. In some examples, the filter circuit may be configured to be coupled to an output of the master stage, such as the output terminal 258. In the example of FIG. 2, the filter circuit includes a low pass filter. The low pass filter circuit ensures that the transient load response component of the control signal is filtered from the filtered control signal at the inverting input terminal 271. As a result, the low pass filter circuit enables the fourth amplifier 263 to amplify a difference between the control signal and the filtered control signal (e.g., amplify the transient load response component of the control signal). However, any other filter circuit may additionally or alternatively be used. For example, the filter circuit may include a high pass filter to ensure that the transient load response component of the control signal is amplified in the filtered control signal.

The output terminal 272 of the fourth amplifier 263 is coupled to the first output terminal 268. The seventh resistor 264 is coupled between the output terminal 272 and the common voltage node 242. The fourth amplifier 263 obtains the control signal and the filtered control signal to generate a feed-forward signal (e.g., a voltage signal VTFF_s) at the output terminal 272 (e.g., the second output terminal 269 of the signal generator 260) proportional to a difference between the voltage at the non-inverting input terminal 270 and the voltage at the inverting input terminal 271. An example formula for a gain generated by the fourth amplifier 263 is shown below in Equation 6:

$$GAIN4 = GM4 * R4 \quad \text{Equation 6}$$

In the example of Equation 6, GAIN4 represents the gain generated by the fourth amplifier 263 at the output terminal, GM4 represents the transconductance characteristic of the fourth amplifier 263, and R4 represents the ohmic resistance of the seventh resistor 264. In the example illustrated in FIG. 2, the slave stage 207 amplifies and filters the control signal obtained at the input terminal 259 to generate the signal VTFF_s. In some examples, the signal VTFF_s may approximate the signal VTFF generated by the master stage 206.

To approximate the signal VTFF, an example formula to calculate GM4 and R4 of Equation 6 corresponding to the schematic of FIG. 2 is shown below in Equation 7:

$$GM4 * R4 = \frac{GM3 * R2}{GM2 * R1} \quad \text{Equation 7}$$

In the example of Equation 7, GM4 represents the transconductance characteristic of the fourth amplifier 263, R4 represents the ohmic resistance of the seventh resistor 264, GM3 represents the transconductance characteristic of the third amplifier 237, R2 represents the ohmic resistance of the fourth resistor 239, GM2 represents the transconductance characteristic of the second amplifier 236, and R1 represents the ohmic resistance of the third resistor 238. The constraints of the example of Equation 7 enable the slave stage 207 to respond to the signal VCONTROL at the input terminal 259 by approximating the signal VTFF at the output terminal 272 of the fourth amplifier 263 (e.g., the signal VTFF_s) and the signal VTFFAVG (e.g., the signal VTFFAVG_s), as discussed below.

The output terminal 272 of the fourth amplifier 263 is coupled to the eighth resistor 265. The fifth capacitor 266 is coupled between to the eighth resistor 265 and the common voltage node 242. The fifth capacitor 266 and the eighth resistor 265 are coupled to the second output terminal 269 of the signal generator 260. In the example of FIG. 2, the seventh resistor 264, the eighth resistor 265, and the fifth capacitor 266 form a filter circuit to obtain the feed-forward signal (such as the signal VTFF_s) and to generate an average feed-forward signal (such as a voltage signal VTFFAVG_s). In some examples, the filter circuit includes a low pass filter, and the signal VTFFAVG_s is generated such that a large difference between the voltage of the signal VTFF_s and the voltage of the signal VTFFAVG_s increases the duty cycle of a signal at the reset input terminal 218B of the latch circuit 216B during a load transient response. Thus, in some examples, the average feed-forward signal (VTFFAVG_s) may represent and/or include an average of the feed-forward signal (VTFF_s) generated by the slave stage 207, such as by the fourth amplifier 263. In some examples, the average feed-forward signal (VTFFAVG_s) generated by the filter circuit including the seventh resistor 264, the eighth resistor 265, and the fifth capacitor 266 may be an average of the feed-forward signal over a period of time, such as the value of VTFF_s over a period of one second.

The slave stage 207 includes a second PWM comparator (e.g., a second comparator circuit 273). In some examples described herein, the second comparator circuit 273 is implemented as a dual differential amplifier. However, any other method to implement the second PWM comparator (e.g., the second comparator circuit 273) may additionally or alternatively be used. The second comparator circuit 273 includes a first non-inverting input terminal 274 coupled to the output terminal 215B of the ramp generator circuit 213B, a first inverting input terminal 275 coupled to the input terminal 259 of the slave stage 207, a second non-inverting input terminal 276 coupled to the second output terminal 269, a second inverting input terminal 277 coupled to first output terminal 268, and an output terminal 278 coupled to the reset input terminal 218B of the latch circuit 216B.

In some examples discussed herein, the second comparator circuit 273 obtains the control signal, the feed-forward signal, the average feed-forward signal, the ramp signal, and the threshold to output an amplifier signal. However, the second comparator circuit 273 may obtain any number of signals and/or thresholds to output an amplifier signal. For example, the second comparator circuit 273 may be configured to obtain the control signal, the feed-forward signal, the average feed-forward signal, and the threshold to output an amplifier signal. In some examples, the generation of the amplifier output signal (such as a variation of a voltage at the output terminal 278) responsive to inputs at the input terminals 274, 275, 276, 277 may result in error amplification.

The second comparator circuit 273 varies a voltage at the output terminal 278 responsive to a comparison of the voltage at the first non-inverting input terminal 274, the voltage at the first inverting input terminal 275, the voltage at the second non-inverting input terminal 276, the voltage at the second inverting input terminal 277, and a threshold. The second PWM comparator (e.g., the second comparator circuit 273) is adapted to output an amplifier signal at the output terminal 278 of the second comparator circuit 273. The second comparator circuit 273 varies the duty cycle of the latch circuit 216B by varying the voltage at the reset input terminal 218B to reset the latch circuit 216B. An example condition of when the second comparator circuit 273 resets the latch circuit 216B is shown below in Equation 8:

$$(VRAMP\_s - VCONTROL) + (VTFFAVG\_s - VTFF\_s) = 0 \quad \text{Equation 8}$$

In the example of Equation 7, VRAMP_s represents the voltage of the signal VRAMP_s at the first non-inverting input terminal 274, VCONTROL represents the voltage of the signal VCONTROL at the first inverting input terminal 275, VTFFAVG_s represents the voltage of the signal VTF-FAVG_s at the second non-inverting input terminal 276, and VTFF_s represents the voltage of the signal VTFF_s at the second inverting input terminal 277. In the example illustrated in FIG. 2, the second comparator circuit 273 resets the latch circuit 216B when Equation 8 is met (i.e., when a comparison of the voltages at the input terminals 274, 275, 276, 277 to the second comparator circuit 273 and a threshold of zero volts is met). However, the second PWM comparator (e.g., the second comparator circuit 273) may reset the latch circuit 216B responsive to any alternative or additional conditions. For example, the second comparator circuit 273 may reset the latch circuit 216B responsive to a comparison of the voltages at the input terminals 274, 275, 276, 277 to a voltage threshold of five volts.

In some examples discussed herein, during a steady state response, the master stage 206 does not generate large variations in the signal VCONTROL, and the voltage at the output terminal 272 remains near the voltage of the ground reference rail 202. The voltage at the output terminal 272 may remain at any reference voltage. For example, if the seventh resistor 264, the eighth resistor 265, and the fifth capacitor 266 were coupled to a second reference rail instead of the ground reference rail 202, and the second reference rail generated a reference voltage (such as four volts, the voltage at the output terminal 272 may remain at the reference voltage (i.e., four volts).

During a steady state response, a difference (VTFF_s−VTFFAVG_s) may be centered around zero volts, and the voltage at the Q output terminal 219B of the latch circuit 216B may respond to a difference between the voltage of the VRAMP_s signal and the voltage of the VCONTROL signal.

In the example of FIG. 2, each of the ramp generator circuits 213A, 213B, the latch circuits 216A, 216B, power stage circuits 220A, 220B, the inductors 223A, 223B, and the capacitors 224A, 224B are implemented as separate components. For example, the master stage 206 includes the ramp generator 213A as a first ramp generator, and the slave stage 207 includes the ramp generator 215B as a second ramp generator. However, any of the ramp generator circuits 213A, 213B, the latch circuits 216A, 216B, power stage circuits 220A, 220B, the inductors 223A, 223B, and the capacitors 224A, 224B may be implemented as single components. For example, the ramp generator circuit 213A, 213B may be implemented as one ramp generator circuit.

In the example illustrated in FIG. 2, the amplifying circuits (such as the first amplifier 234, the second amplifier 236, the third amplifier 237, and the fourth amplifier 263) are implemented as transconductance amplifier circuits. Transconductance amplifiers include a non-inverting input terminal, an inverting input terminal, and an output terminal. A transconductance amplifier may vary a current at the output terminal proportionally to a difference in a voltage at the non-inverting input terminal and a voltage at the inverting input terminal. However, any other methods to implement the first amplifier 234, the second amplifier 236, and the third amplifier 237 may additionally or alternatively be used. For example, the first amplifier, the second amplifier, or the third amplifier may be implemented as operational amplifiers. Further, any number of circuits, amplifiers, or suitable discrete components may be used to implement the amplifying circuits.

Similarly, in the example of FIG. 2, the comparator circuits (such as the first comparator circuit 252 and the second comparator circuit 273) are implemented as dual-differential amplifiers. However, any other methods to implement the comparator circuits may be used. Further, any number of circuits, amplifiers, or suitable discrete components may be used to implement the comparator circuits.

Figure 3A:
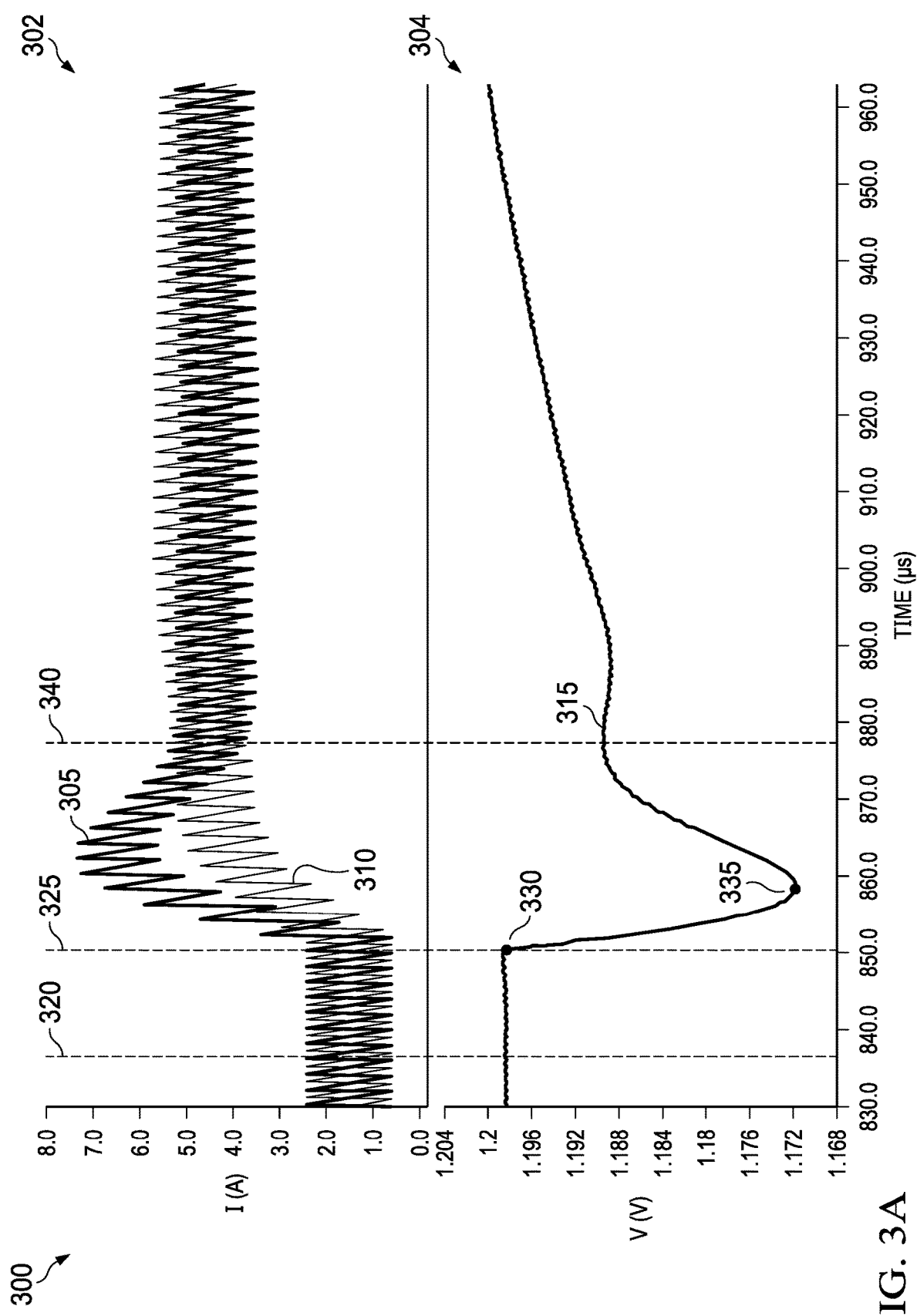
FIGS. 3A and 3B are signal plots depicting current and output voltage signals of the power conversion systems of FIGS. 1 and 2 during a steady state load and a transient load.

FIG. 3A is a signal plot 300 depicting current and output voltage signals of the power conversion system 100 of FIG. 1 during a steady state load and a transient load. The signal plot 300 of FIG. 3A includes a first depiction 302 and a second depiction 304. The first depiction 302 includes a first current signal (line 305) and a second current signal (line 310). The second depiction 304 includes an output voltage signal (line 315). In FIG. 3A, the first current signal (line 305) represents a current through the inductor 123A, and the second current signal (line 310) represents a current through the inductor 123B. Moreover, the output voltage signal (line 315) represents the voltage at the output node 108.

At an example first time interval 320, the first current signal (line 305) and the second current signal (line 310) are periodic inverse sawtooth waveforms centered at 1.5 amperes. As a result, at the first time interval 320, the output voltage signal (line 315) is 1.198 volts.

At a second example time interval 325, the ohmic resistance of the load 103 becomes a transient load. As a result, the output voltage signal (line 315) decreases from 1.198 volts at a first time of 850 microseconds (point 330) to 1.17 volts at a second time of 858 microseconds (point 335). In the illustration of FIG. 3A, a change in the output voltage signal (line 315) from a first voltage (point 330) to a second voltage (point 335) includes a decrease in voltage by 26.6 millivolts over 8.15 microseconds. Responsive to the decrease in voltage of the output voltage signal (line 315), the first current signal (line 305) increases to an inverse sawtooth waveform centered at 4.25 amperes, and the second current signal (line 310) increases to an inverse sawtooth waveform centered at 6.5 amperes.

At a third time interval 340, the output voltage signal (line 315) stabilizes to 1.19 volts. As a result, the first current signal (line 305) stabilizes to an inverse sawtooth waveform centered at 4.25 amperes, and the second current signal (line 310) stabilizes to an inverse sawtooth waveform centered at 4.75 amperes. As a result, the output voltage signal (line 315) begins to increase to a desired voltage.

Figure 3B:
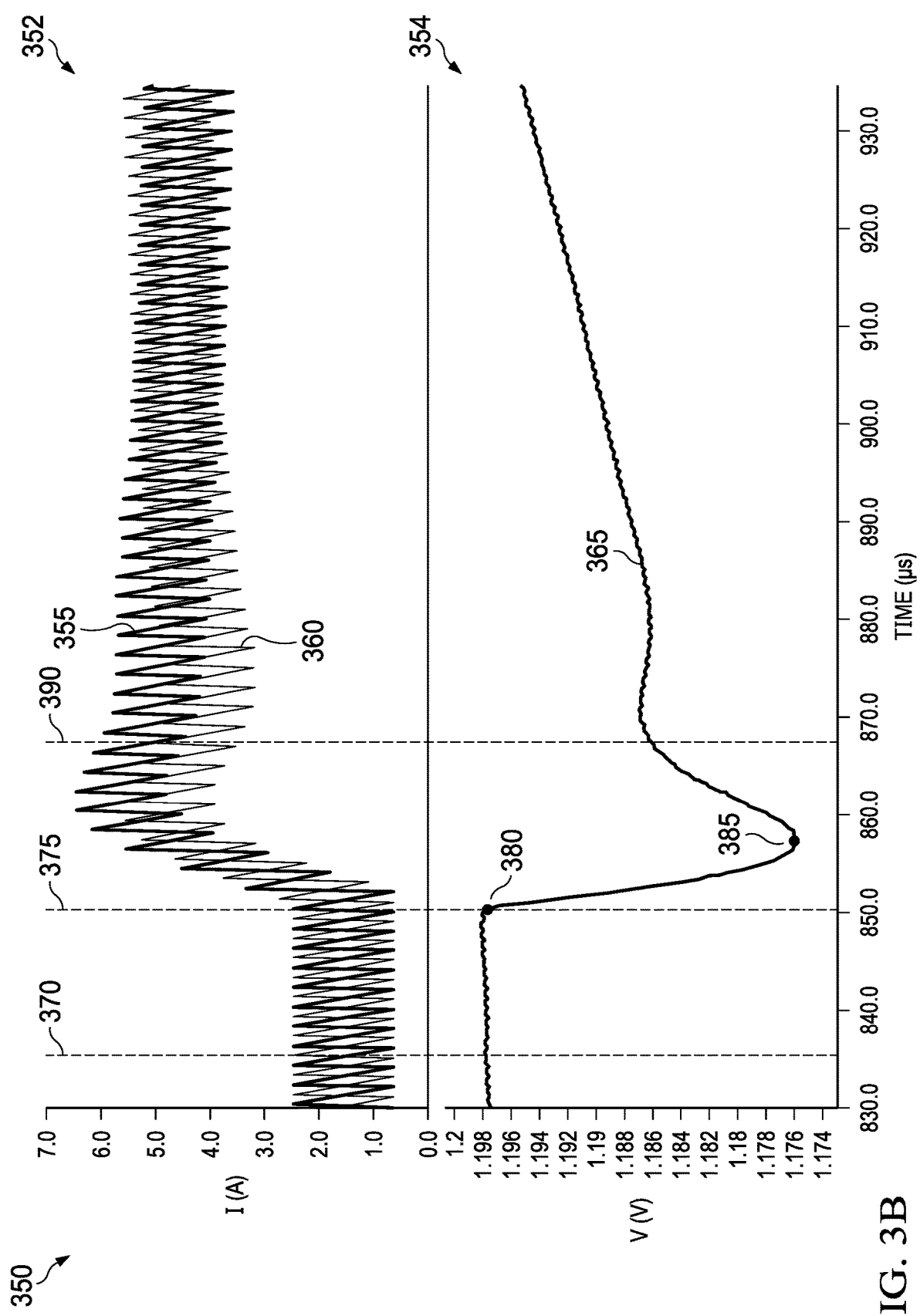

FIG. 3B is a signal plot 350 depicting current and output voltage signals of the power conversion system 200 of FIG. 2 during a steady state load and a transient load. The example signal plot 350 of FIG. 3B includes a first depiction 352 and a second depiction 354. The first depiction 352 includes a first current signal (line 355) and a second current signal (line 360). The second depiction 354 includes an output voltage signal (line 365). In FIG. 3B, the first current signal (line 355) may represent a current through the inductor 223A, and the second current signal (line 360) may represent a current through the inductor 223B. Moreover, the output voltage signal (line 365) may represent the voltage at the output node 208. In the signal plot 350 of FIG. 3B, the magnitude of the voltage or current of any of the signals may be any suitable value.

At an example first time interval 370, the first current signal (line 355) and the second current signal (line 360) are periodic inverse sawtooth waveforms centered at 1.5 amperes. As a result, at the first time interval 370, the output voltage signal (line 365) is 1.197 volts.

At an example second time interval 375, the ohmic resistance of the load 203 may be changed. For example, a transient load may occur due to the addition of a second load coupled to the output node 208. As a result, the output voltage signal (line 365) decreases from 1.198 volts at a first time of 850 microseconds (point 380) to 1.17 volts at a second time of 857 microseconds (point 385).

The master stage 206 constructs the feed-forward signal (e.g., the signal VTFF) and the average feed-forward signal (e.g., the signal VTFFAVG) based on the signal obtained at the second input terminal 230 of the signal controller 228, and the slave stage 207 generates the feed-forward signal (e.g., the signal VTFF_s) and the average feed-forward signal (e.g., the signal VTFFAVG_s) based on the control signal obtained at the input terminal 259. Therefore, the master stage 206 and the slave stage 207 may both respond to the decrease in the output voltage signal (line 365) more efficiently than a response without a generation of feed-forward signals by the slave stage 207 (e.g., the signal VTFF_s and the signal VTFFAVG_s). As a result, the output voltage signal (line 365) from a first voltage (point 380) to a second voltage (point 385) may include a decrease in voltage by 22.2 millivolts over 7.9 microseconds. The decrease in voltage of FIG. 3B is less than that of the decrease in voltage of FIG. 3A, and the time over which the output voltage signal (line 365) decreases in FIG. 3B is less than the time over which the output voltage signal (line 315) decreases in FIG. 3A.

Responsive to the decrease in voltage of the output voltage signal (line 365), the first current signal (line 355) increases to an inverse sawtooth waveform centered at 4.25 amperes, and the second current signal (line 360) increases to an inverse sawtooth waveform centered at 6.5 amperes.

At an example third time interval 390, the output voltage signal (line 365) stabilizes to 1.185 volts. As a result, the first current signal (line 355) stabilizes to an inverse sawtooth waveform centered at 4.5 amperes, and the second current signal (line 360) stabilizes to an inverse sawtooth waveform centered at 4.5 amperes. As a result of the stabilization of the first current signal (line 355) and the stabilization of the second current signal (line 360), the output voltage signal (line 365) begins to steadily increase to a desired voltage.

Figure 4A:
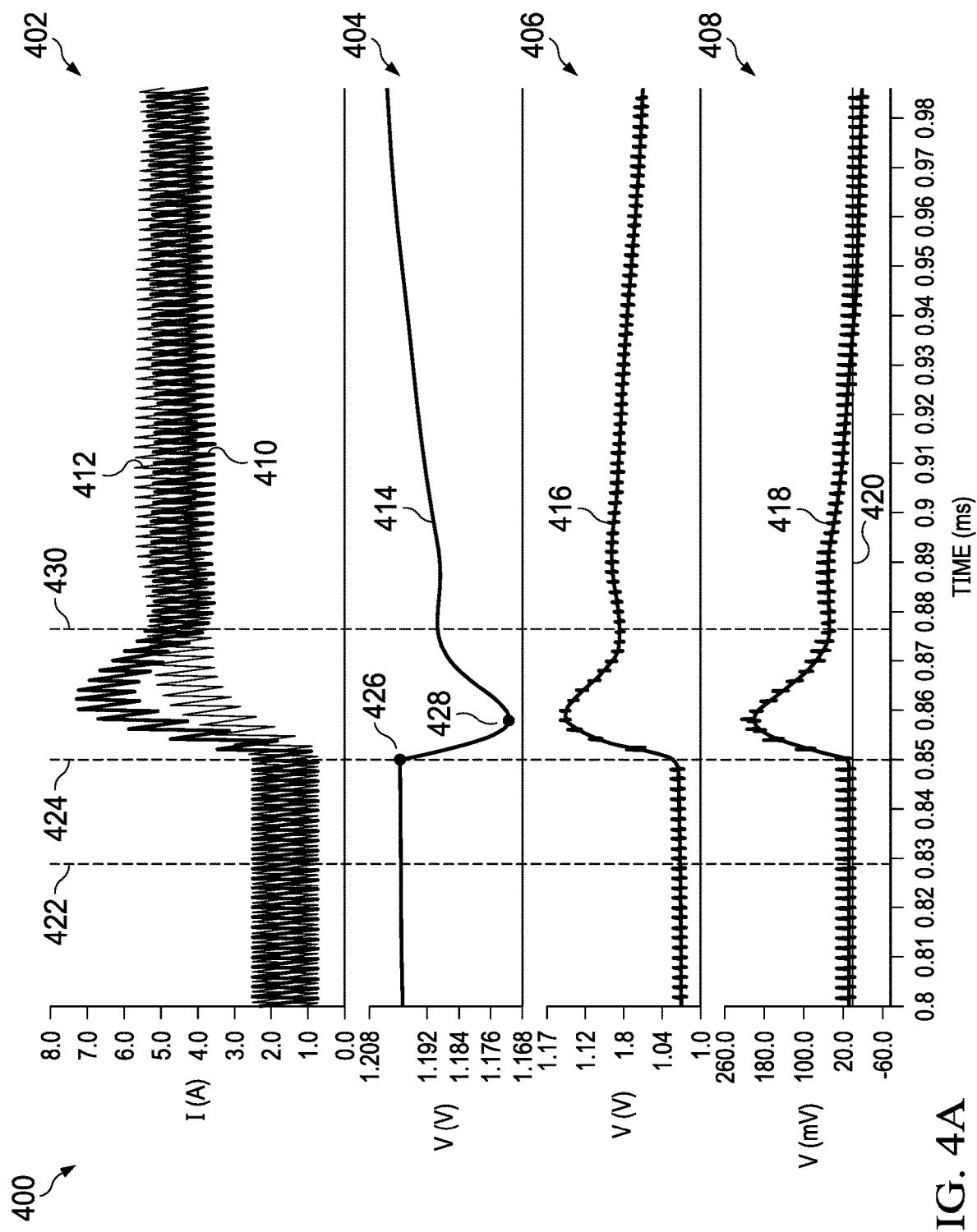
FIGS. 4A and 4B are signal plots depicting additional signals of the power conversion systems of FIGS. 1 and 2 during a steady state load and a transient load.

FIG. 4A is a signal plot 400 depicting additional signals of the power conversion system 100 of FIG. 1 during a steady state load and a transient load. The signal plot 400 of FIG. 4A includes a first depiction 402, a second depiction 404, a third depiction 406, and a fourth depiction 408. The first depiction 402 includes a first current signal (line 410) and a second current signal (line 412). The second depiction 404 includes an output voltage signal (line 414). The third depiction 406 includes a control voltage signal (line 416). The fourth depiction 408 includes a first differential voltage signal (line 418) and a second differential voltage signal (line 420).

In FIG. 4A, the first current signal (line 410) represents a current through the inductor 123A, and the second current signal (line 412) represents a current through the inductor 123B. The output voltage signal (line 414) represents the voltage at the output node 108. The control voltage signal (line 416) represents the voltage at the first inverting input terminal 154 of the first comparator circuit 152 (i.e., a terminal coupled to the signal controller 128 to obtain the signal VCONTROL). The first differential voltage signal (line 418) represents a comparison of the voltage at the second inverting input terminal 156 of the first comparator circuit 152 (i.e., a terminal coupled to the signal controller 128 to obtain the signal VTFF) to the voltage at the second non-inverting input terminal 155 of the first comparator circuit 152 (i.e., a terminal coupled to the signal controller 128 to obtain the signal VTFFAVG).

The second differential voltage signal (line 420) represents a difference of a first signal and a second signal generated by the slave stage 107. The slave stage 107 does not generate any signals based on the control signal (VCONTROL). Therefore, the voltage of the second differential voltage signal (line 420), which represents a difference of a first signal and a second signal generated by the slave stage 107, remains at zero volts.

At a first time interval 422, the control voltage signal (line 416) is 1.2 volts, the first differential voltage signal (line 418) is zero volts, and the second differential voltage signal (line 420) is zero volts. As a result, the first current signal (line 410) and the second current signal (line 412) are stable periodic inverse sawtooth waveforms centered at 1.5 amperes. The output voltage signal (line 414) is 1.196 volts.

At a second time interval 424, the ohmic resistance of the load 103 changes to a transient load. As a result, the output voltage signal (line 414) decreases from 1.2 volts at a first time 850 microseconds (point 426) to 1.17 volts at a second time 858 microseconds (point 428). The change in the output voltage signal (line 414) from a first voltage (point 426) to a second voltage (point 428) is a decrease in voltage by 26.6 millivolts over 8.15 microseconds. Responsive to the decrease in voltage of the output voltage signal (line 414), the control voltage signal (line 416) increases to 1.14 volts, the first differential voltage signal (line 418) increases to 190 millivolts, and the second differential voltage signal (line 420) remains at zero volts. Responsive to the increase in the control voltage signal (line 416) and the increase in the first differential voltage signal (line 418), the first current signal (line 410) increases to an inverse sawtooth waveform centered at 6.5 amperes. Responsive to the increase in the control voltage signal (line 416), the second current signal (line 412) increases to an inverse sawtooth waveform centered at 4.5 amperes. As a result, the output voltage signal (line 414) begins to increase from 1.17 volts.

At an example third time interval 430, the output voltage signal (line 414) stabilizes to 1.19 volts. As a result, the control voltage signal (line 416) begins to decrease towards zero volts, the first differential voltage signal (line 418) begins to decrease, and the second differential voltage signal (line 420) remains at zero volts. Responsive to the decrease in the control voltage signal (line 416) and the decrease in the first differential voltage signal (line 418), the first current signal (line 410) stabilizes to an inverse sawtooth waveform centered at 4.25 amperes. Responsive to the decrease in the control voltage signal (line 416), the second current signal (line 412) stabilizes to an inverse sawtooth waveform centered at 4.75 amperes. As a result, the output voltage signal (line 414) begins to increase.

Figure 4B:
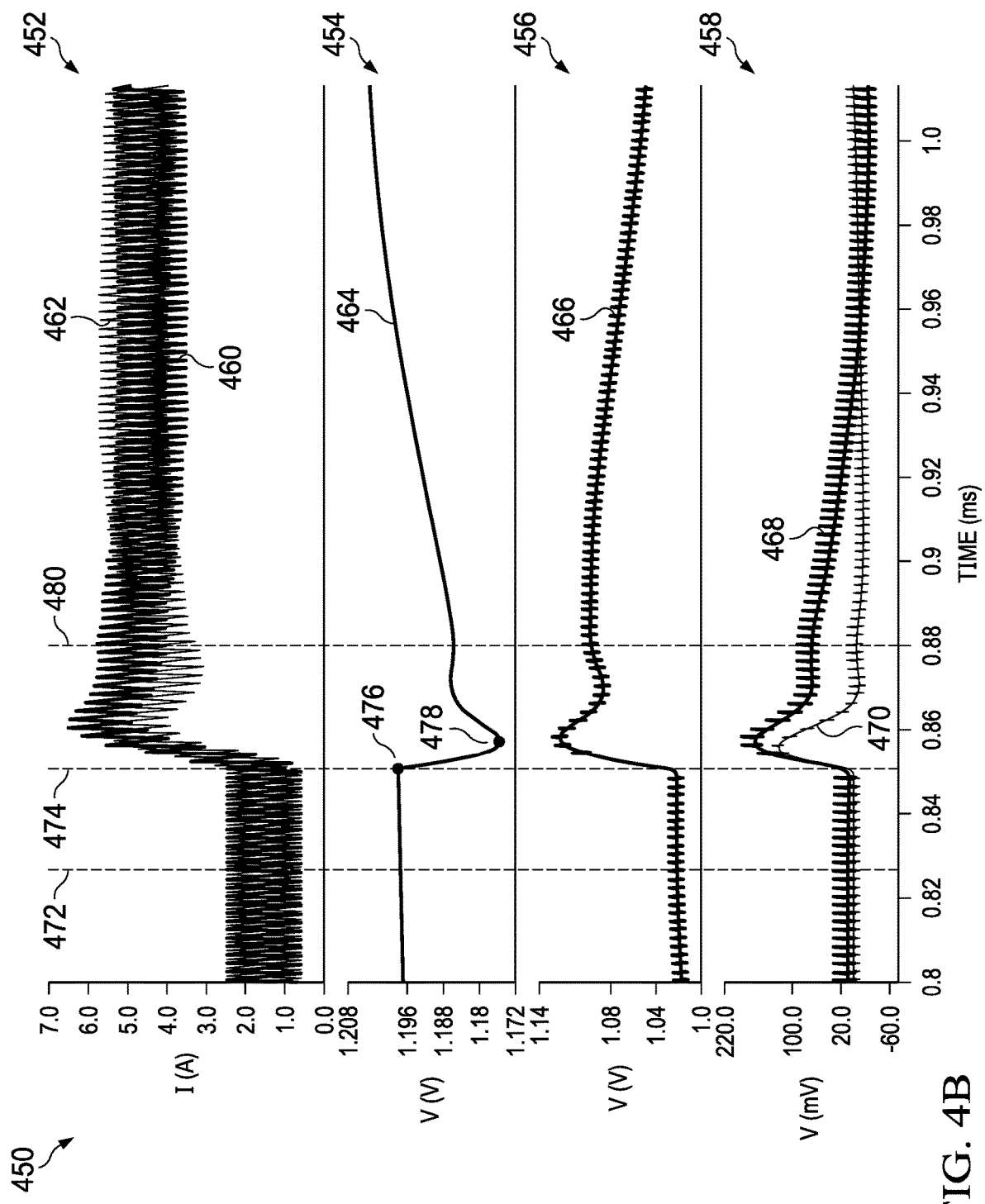

FIG. 4B is a signal plot 450 depicting additional signals of the power conversion system 200 of FIG. 2 during a steady state load and a transient load. The example signal plot 450 of FIG. 4B includes a first depiction 452, a second depiction 454, a third depiction 456, and a fourth depiction 458. The first depiction 452 includes a first current signal (line 460) and a second current signal (line 462). The second depiction 454 includes an output voltage signal (line 464). The third depiction 456 includes a control voltage signal (line 466). The fourth depiction 458 includes a first differential voltage signal (line 468) and a second differential voltage signal (line 470).

In FIG. 4B, the first current signal (line 460) may represent a current through the inductor 223A, and the second current signal (line 462) may represent a current through the inductor 223B. The output voltage signal (line 464) may represent the voltage at the output node 208. The control voltage signal (line 466) may represent the voltage at the first inverting input terminal 254 of the first comparator circuit 252 (e.g., the voltage of the signal VCONTROL).

The first differential voltage signal (line 468) may represent a comparison of the voltage at the second inverting input terminal 256 (e.g., the voltage of the signal VTFF) to the voltage at the second non-inverting input terminal 255 (e.g., the voltage of the signal VTFFAVG). The second differential voltage signal (line 470) may represent a comparison of the voltage at the second inverting input terminal 277 (e.g., the voltage of the signal VTFF_s) to the voltage at the second non-inverting input terminal 276 (e.g., the voltage of the signal VTFFAVG_s). In the example of FIG. 4B, the slave stage 207 may filter and/or amplify the control voltage signal (line 466) to generate the signal VTFF_s and the signal VTFFAVG_s.

At an example first time interval 472, the control voltage signal (line 466) is 1.2 volts, the first differential voltage signal (line 468) is ten millivolts, and the second differential voltage signal (line 470) is zero volts. As a result, the first current signal (line 460) and the second current signal (line 462) are stable periodic inverse sawtooth waveforms centered at 1.5 amperes. Therefore, at the first time interval 472, the output voltage signal (line 464) is 1.196 volts.

At an example second time interval 474, the ohmic resistance of the load 203 may be changed. For example, a transient load may occur due to the addition of a second load coupled to the output node 208. As a result, the output voltage signal (line 464) decreases from 1.198 volts at a first time 850 microseconds (point 476) to 1.17 volts at a second time 858 microseconds (point 478). In the example illustrated in FIG. 4B, a change in the output voltage signal (line 464) from a first voltage (point 476) to a second voltage (point 478) may include a decrease in voltage by 21.9 millivolts over 8.025 microseconds.

As mentioned above, the master stage 206 constructs feed-forward signals (e.g., the signal VTFF and the signal VTFFAVG), and the slave stage 207 generates feed-forward signals (e.g., the signal VTFF_s and the signal VTFFAVG_s) based on the signal configured to be obtained at the input terminal 259. Therefore, the master stage 206 and the slave stage 207 may both respond to a decrease in the output voltage signal (line 464) more efficiently than a response without a generation of the feed-forward signals by the slave stage 207. As a result, the decrease in voltage of FIG. 4B is less than that of the decrease in voltage of FIG. 4A, and the time over which the output voltage signal (line 464) decreases in FIG. 4B is less than the time over which the output voltage signal (line 414) decreases in FIG. 4A.

Responsive to the decrease in voltage of the output voltage signal (line 464), the control voltage signal (line 466) increases to 1.12 volts, the first differential voltage signal (line 468) increases to 137 millivolts, and the second differential voltage signal (line 470) increases to 120 volts. Responsive to the increase in the control voltage signal (line 466) and the increase in the first differential voltage signal (line 468), the first current signal (line 460) increases to an inverse sawtooth waveform centered at 5.25 amperes. Responsive to the increase in the control voltage signal (line 466), the second current signal (line 462) increases to an inverse sawtooth waveform centered at 4.75 amperes. As a result, the output voltage signal (line 464) begins to increase from 1.17 volts.

At an example third time interval 480, the output voltage signal (line 464) stabilizes to 1.175 volts. As a result, the control voltage signal (line 466) begins to decrease, the first differential voltage signal (line 468) begins to decrease, and the second differential voltage signal (line 470) begins to decrease. Responsive to the decrease in the control voltage signal (line 466) and the decrease in the first differential voltage signal (line 468), the first current signal (line 460) stabilizes to an inverse sawtooth waveform centered at 4.5 amperes. Responsive to the decrease in the control voltage signal (line 466), the second current signal (line 462) stabilizes to an inverse sawtooth waveform centered at 4.5 amperes. As a result, the output voltage signal (line 464) begins to steadily increase.

Figure 5:
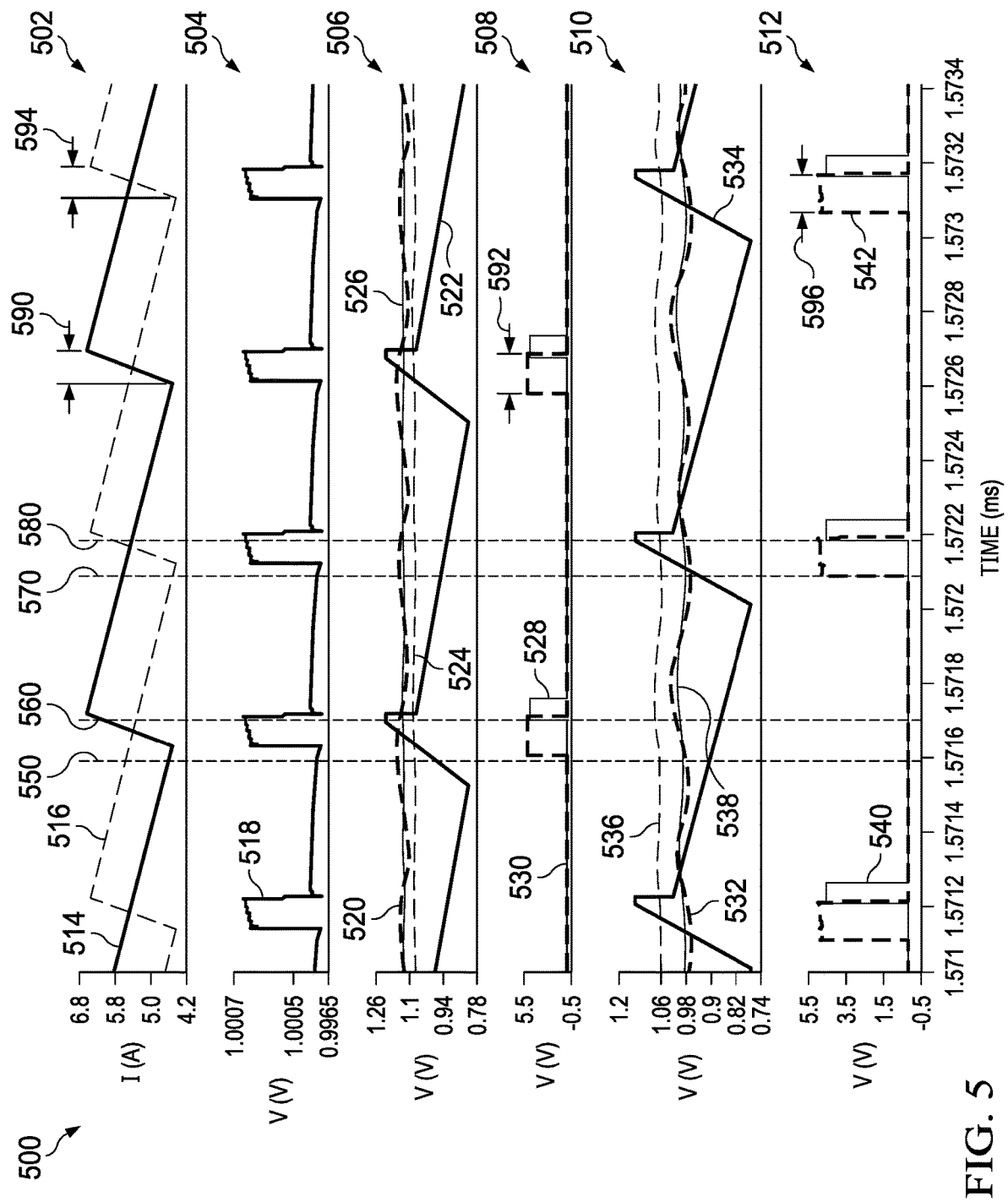
FIG. 5 is a signal plot depicting control signals and output signals of the power conversion system of FIG. 2 during a steady state load example.

FIG. 5 is a signal plot 500 depicting control signals and output signals of the power conversion system 200 of FIG. 2 during a steady state load example. The signal plot 500 may depict the steady state load example included in the first time interval 472 of FIG. 4B. The example signal plot 500 of FIG. 5 includes a first depiction 502, a second depiction 504, a third depiction 506, a fourth depiction 508, a fifth depiction 510, and a sixth depiction 512.

The first depiction includes a first output current (line 514) and a second output current (line 516). The first output current (line 514) may represent a current through the inductor 223A, and the second example output current (line 516) may represent a current through the inductor 223B. The second depiction 504 includes an output voltage signal (line 518). The output voltage signal (line 518) may represent the voltage at the output node 208.

The third depiction 506 includes a first feed-forward voltage signal (line 520), a first ramp voltage signal (line 522), a first control voltage signal (line 524), and a first average feed-forward voltage signal (line 526). In the example illustrated in FIG. 5, signals in the third depiction 506 correspond to signals at the input terminals 253, 254, 255, 256 of the first comparator circuit 252. The first feed-forward voltage signal (line 520) may represent the voltage at the second inverting input terminal 256 of the first comparator circuit 252 (e.g., the signal VTFF). The first ramp voltage signal (line 522) may represent the voltage at the first non-inverting input terminal 253 of the first comparator circuit 252 (i.e., the signal VRAMP). The first control voltage signal (line 524) may represent the voltage at the first inverting input terminal 254 of the first comparator circuit 252 (i.e., the signal VCONTROL). The first average feed-forward voltage signal (line 526) may represent the voltage at the second non-inverting input terminal 255 of the first comparator circuit 252 (i.e., the signal VTFFAVG).

The fourth depiction 508 includes a first amplifier output voltage signal (line 528) and a first latch output voltage signal (line 530). The first amplifier output voltage signal (line 528) may represent the voltage at the output terminal 257 of the first comparator circuit 252. The first latch output voltage signal (line 530) may represent the voltage at the Q output terminal 219A of the latch circuit 216A of the master stage 206.

The fifth depiction 510 includes a second feed-forward voltage signal (line 532), a second ramp voltage signal (line 534), a second control voltage signal (line 536), and a second average feed-forward voltage signal (line 538). In the example illustrated in FIG. 5, signals in the fifth depiction 510 correspond to signals at the input terminals 274, 275, 276, 277 of the second comparator circuit 273. The second feed-forward voltage signal (line 532) may represent the voltage at the second inverting input terminal 277 (i.e., the signal VTFF_s). The second ramp voltage signal (line 534) may represent the voltage at first non-inverting input terminal 274 (i.e., the signal VRAMP_s). The second control voltage signal (line 536) may represent the voltage at the first inverting input terminal 275 (i.e., the signal VCONTROL). The second average feed-forward voltage signal (line 538) may represent the voltage at the second non-inverting input terminal 276 (i.e., the signal VTFFAVG_s).

The sixth depiction 512 includes a second amplifier output voltage signal (line 540) and a second latch output voltage signal (line 542). The second amplifier output voltage signal (line 540) may represent the voltage at the output terminal 278 of the second comparator circuit 273. The second latch output voltage signal (line 542) may represent the voltage at the Q output terminal 219B of the latch circuit 216B of the slave stage 207, as discussed below.

At a first example time interval 550, the signal CLOCK at the set input terminal 217A of the latch circuit 216A rises (e.g., to one volt), and the voltage of the first amplifier output voltage signal (line 528) is zero volts, so the latch circuit 216A of the master stage 206 responds by raising the first latch output voltage signal (line 530) to five volts. The first output current (line 514) rises to 6.8 amperes, and the output voltage signal (line 518) rises to one volt.

In the example illustrated in FIG. 5, the load 203 is in a steady state. In other words, there is no load transient in the example of FIG. 5. Therefore, the first feed-forward voltage signal (line 520) and the first average feed-forward voltage signal (line 526) remain at 1.1 volts. As a result, the voltage at the output terminal 257 of the first comparator circuit 252 is responsive to changes in the first ramp voltage signal (line 522) compared to the first control voltage signal (line 524), as discussed above in connection with Equation 5. The first comparator circuit 252 responds to the voltage of the first ramp voltage signal (line 522) exceeding the voltage of the first control voltage signal (line 524) by raising the voltage of the first amplifier output voltage signal (line 528), and the latch circuit 216A responds by resetting the first latch output voltage signal (line 530) to zero volts, as discussed below.

At a second example time interval 560, the first ramp voltage signal (line 522) is 1.2 volts and has exceeded the first control voltage signal (line 524). The first amplifier output voltage signal (line 528) raises to five volts, and the first latch output voltage signal (line 530) resets to zero volts. Responsive to the reset of the first latch output voltage signal (line 530), the first output current (line 514) peaks at 6.5 amperes and begins to decrease. As a result, the output voltage signal (line 518) decreases to zero volts.

At a third example time interval 570, the signal CLOCK at the set input terminal 217B of the latch circuit 216B rises (e.g., up to one volt), and the second amplifier output voltage signal (line 540) is zero volts, so the latch circuit 216B of the slave stage 207 responds by raising the second latch output voltage signal (line 542) to five volts. The second output current (line 516) rises to 6.8 amperes, and the output voltage signal (line 518) rises to one volt.

As mentioned above, there is no load transient in the example of FIG. 5. Therefore, the second feed-forward voltage signal (line 532) and the second average feed-forward voltage signal (line 538) remain at 1.1 volts. As a result, the voltage at the output terminal 278 of the second comparator circuit 273 is responsive to changes in the second ramp voltage signal (line 534) compared to the second control voltage signal (line 536), as discussed above in connection with Equation 8. The second comparator circuit 273 responds to the voltage of the second ramp voltage signal (line 534) exceeding the voltage of the second control voltage signal (line 536) by raising the voltage of the second amplifier output voltage signal (line 540), and the latch circuit 216B responds by resetting the second latch output voltage signal (line 542), as discussed below.

At a fourth example time interval 580, the second ramp voltage signal (line 534) is 1.2 volts and has exceeded the second control voltage signal (line 536). The second amplifier output voltage signal (line 540) raises to five volts, and the second latch output voltage signal (line 542) resets to zero volts. Responsive to the reset of the second latch output voltage signal (line 542), the second output current (line 516) peaks at 6.5 amperes and begins to decrease. As a result, the output voltage signal (line 518) decreases to zero volts.

In the example illustrated in FIG. 5, the current output by the power stage circuit 220A of the master stage 206 is controlled by the pulse width of the first amplifier output voltage signal (line 528). In other words, a time interval (e.g., a first example pulse width 590) over which the power stage circuit 220A of the master stage 206 provides the first output current (line 514) to the inductor 223A corresponds to a time interval (e.g., a second example pulse width 592) over which the first latch output voltage signal (line 530) is asserted. Similarly, a time interval (e.g., a third example pulse width 594) over which the power stage circuit 220B of the slave stage 207 provides the second output current (line 516) to the inductor 223B corresponds to a time interval (e.g., a fourth example pulse width 596) over which the second latch output voltage signal (line 542) is asserted.

For both the master stage 206 and the slave stage 207, each voltage at the Q output terminals 219A, 219B is responsive to a variation in voltage at the respective reset input terminal 218A, 218B. Further, because there is no load transient in the example of FIG. 5, each comparator circuit 252, 273 corresponding to each stage 206, 207 is responsive to changes in the ramp voltage signal (lines 522, 534) corresponding to each stage 206, 207. In other words, the first comparator circuit 252 is responsive to changes in the first ramp voltage signal (line 522), and the second comparator circuit 273 is responsive to changes in the second ramp voltage signal (line 534). Therefore, the pulse width of the first latch output voltage signal (line 530) is responsive to a delay for the first ramp voltage signal (line 522) to reach the output voltage signal (line 518), and the pulse width of the second latch output voltage signal (line 542) is responsive to a delay for the second ramp voltage signal (line 534) to reach the output voltage signal (line 518). In some examples, the delay for the first ramp voltage signal (line 522) may include a time delay of the first comparator circuit 252 to obtain signals at the input terminals 253, 254, 255, 256 and provide an output signal at the output terminal 257. Similarly, in some examples, the delay for the second ramp voltage signal (line 534) to obtain signals at the input terminals 274, 275, 276, 277 and provide an output signal at the output terminal 278.

Figure 6:
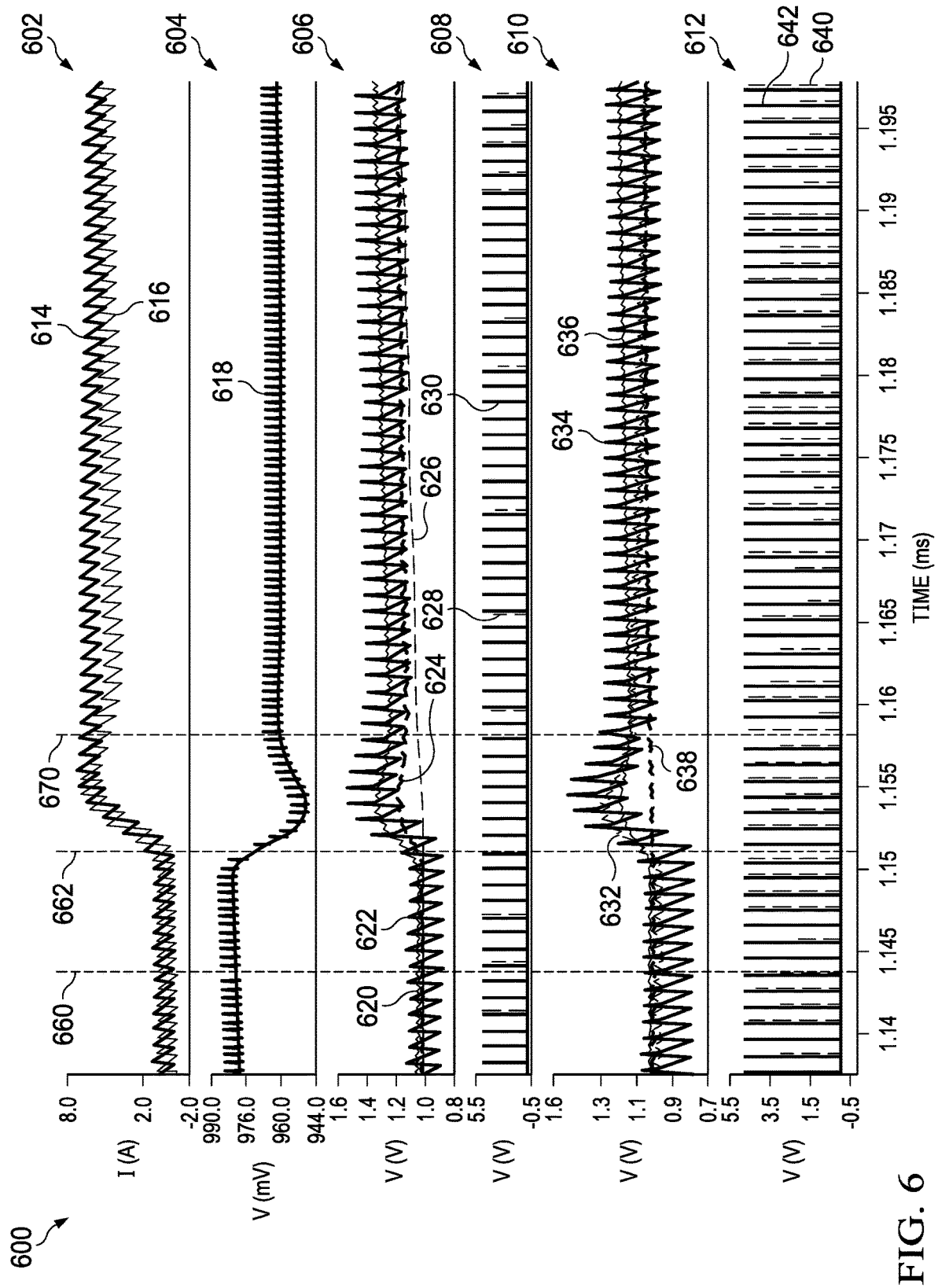
FIG. 6 is a signal plot depicting control signals and output signals of the power conversion system of FIG. 2 during a steady state load and a transient load.

FIG. 6 is a signal plot 600 depicting control signals and output signals of the power conversion system 200 of FIG. 2 during a steady state load and a transient load. The example signal plot 600 includes a first depiction 602, a second depiction 604, a third depiction 606, a fourth depiction 608, a fifth depiction 610, and a sixth depiction 612.

The first depiction 602 includes a first output current (line 614) and a second output current (line 616). The first output current (line 614) may represent a current through the inductor 223A, and the second output current (line 616) may represent a current through the inductor 223B. The second depiction 604 includes an output voltage signal (line 618). The output voltage signal (line 618) may represent the voltage at the output node 208.

The third depiction 606 includes a first feed-forward voltage signal (line 620), a first ramp voltage signal (line 622), a first control voltage signal (line 624), and a first average feed-forward voltage signal (line 626). In the example illustrated in FIG. 6, signals in the third depiction 606 correspond to signals at the input terminals 253, 254, 255, 256 of the first comparator circuit 252. The first feed-forward voltage signal (line 620) may represent the voltage at the second inverting input terminal 256 of the first comparator circuit 252 (e.g., the signal VTFF). The first ramp voltage signal (line 622) may represent the voltage at the first non-inverting input terminal 253 of the first comparator circuit 252 (e.g., the signal VRAMP). The first control voltage signal (line 624) may represent the voltage at the first inverting input terminal 254 of the first comparator circuit 252 (e.g., the signal VCONTROL). The first average feed-forward voltage signal (line 626) may represent the voltage at the second non-inverting input terminal 255 of the first comparator circuit 252 (e.g., the signal VTFFAVG).

The fourth depiction 608 includes a first amplifier output voltage signal (line 628) and a first latch output voltage signal (line 630). The first amplifier output voltage signal (line 628) may represent the voltage at the output terminal 257 of the first comparator circuit 252. The first latch output voltage signal (line 630) may represent the voltage at the Q output terminal 219A of the latch circuit 216A of the master stage 206.

The fifth depiction 610 includes a second feed-forward voltage signal (line 632), a second ramp voltage signal (line 634), a second control voltage signal (line 636), and a second average feed-forward voltage signal (line 638). In the example illustrated in FIG. 6, signals in the fifth depiction 610 correspond to signals at the input terminals 274, 275, 276, 277 of the second comparator circuit 273. The second feed-forward voltage signal (line 632) may represent the voltage at the second inverting input terminal 277 (e.g., the signal VTFF_s). The second ramp voltage signal (line 634) may represent the voltage at first non-inverting input terminal 274 (e.g., the signal VRAMP_s). The second control voltage signal (line 636) may represent the voltage at the first inverting input terminal 275 (e.g., the signal VCONTROL). The second average feed-forward voltage signal (line 638) may represent the voltage at the second non-inverting input terminal 276 (e.g., the signal VTFFAVG_s).

The sixth depiction 612 includes a second amplifier output voltage signal (line 640) and a second latch output voltage signal (line 642). The second amplifier output voltage signal (line 640) may represent the voltage at the output terminal 278 of the second comparator circuit 273. The second latch output voltage signal (line 642) may represent the voltage at the Q output terminal 219B of the latch circuit 216B of the slave stage 207.

At a first example time interval 660, the output node 208 is coupled to the load 203 in a steady state (i.e., there is not a transient load), and the signals depicted in the signal plot 600 behave accordingly (e.g., in a manner similar to the example illustrated in FIG. 5). In other words, because the load 203 is in a steady state, the first output current (line 614) and the second output current (line 616) are periodic inverse sawtooth waveforms centered at zero amperes, and the output voltage signal (line 618) is 980 millivolts. The first feed-forward voltage signal (line 620), the first control voltage signal (line 624), and the first average feed-forward voltage signal (line 626) remain at 1.1 volts. The first ramp voltage signal (line 622) is a periodic inverse sawtooth waveform centered at 1.1 volts.

Further, the second feed-forward voltage signal (line 632), the second control voltage signal (line 636), and the second average feed-forward voltage signal (line 638) remain at 0.99 volts. The second ramp voltage signal (line 634) is a periodic inverse sawtooth waveform centered at one volt.

Responsive to variations in the first feed-forward voltage signal (line 620), the first ramp voltage signal (line 622), the first control voltage signal (line 624), and the first average feed-forward voltage signal (line 626), the first amplifier output voltage signal (line 628) is a pulse with a maximum of five volts. The first latch output voltage signal (line 630) is a pulse at five volts. Similarly, responsive to variations in the second feed-forward voltage signal (line 632), the second ramp voltage signal (line 634), the second control voltage signal (line 636), and the second average feed-forward voltage signal (line 638), the second amplifier output voltage signal (line 640) is a pulse with a maximum of five volts. The second latch output voltage signal (line 642) is a pulse at five volts.

At a second example time interval 662, a transient load occurs at the output node 208 (e.g., a resistive load is coupled to the output node 208). The output voltage signal (line 618) begins to decrease from 980 millivolts. The first feed-forward voltage signal (line 620), the first control voltage signal (line 624), the second feed-forward voltage signal (line 632), and the second control voltage signal (line 636) increase responsive to the output voltage signal (line 618). However, the first average feed-forward voltage signal (line 626) remains at 1.1 volts, and the second average feed-forward voltage signal (line 638) remains at 0.99 volts.

The pulse widths of the first latch output voltage signal (line 630) and the pulse widths of the second latch output voltage signal (line 642) increase, as discussed below in connection with FIG. 7. The first output current (line 614) increases to 6.5 amperes in order to regulate the output voltage signal (line 618), and the second output current (line 616) increases to 6.5 amperes in order to regulate the output voltage signal (line 618). As a result of the increase in the first output current (line 614) and the increase in the second output current (line 616), the decrease in voltage of the output voltage signal (line 618) slows to a minimum voltage of 950 millivolts.

At a third example time interval 670, responsive to the increase in the first output current (line 614) and the increase in the second output current (line 616), the output voltage signal (line 618) normalizes to (e.g., settles to, is regulated at) 960 millivolts. Once the output voltage signal (line 618) has normalized, the first feed-forward voltage signal (line 620), the first ramp voltage signal (line 622), the first control voltage signal (line 624), the first average feed-forward voltage signal (line 626), the second feed-forward voltage signal (line 632), the second ramp voltage signal (line 634), the second control voltage signal (line 636), and the second average feed-forward voltage signal (line 638) each normalize. As a result, the pulse widths decrease, as discussed below in connection with FIG. 7. Responding to the decrease in pulse widths, the first output current (line 614) decreases to 5.5 amperes, and the second output current (line 616) decreases to 4.5 amperes. The output voltage signal (line 618) normalizes to 960 millivolts.

Figure 7:
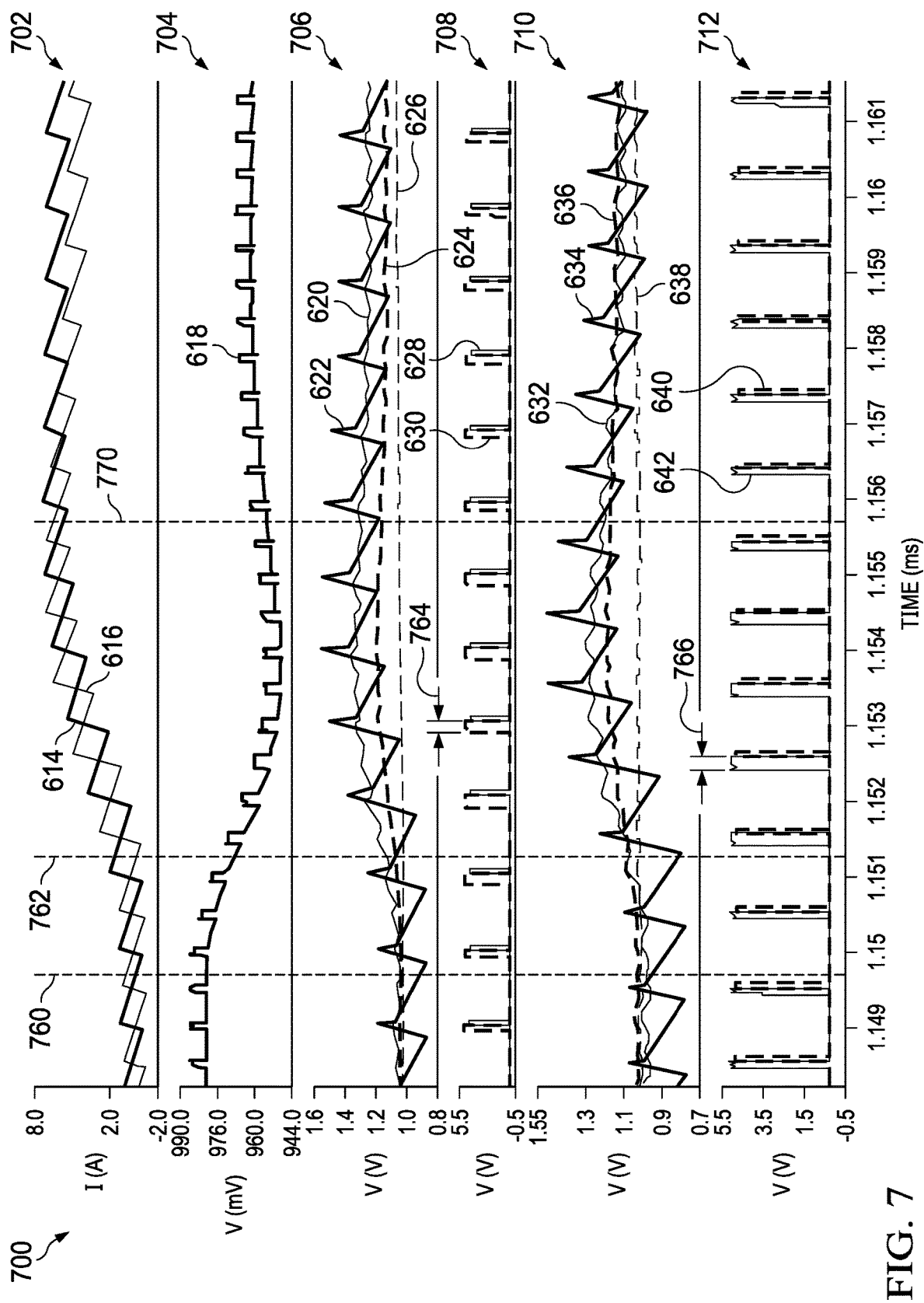
FIG. 7 is a signal plot depicting more detail of the control signals and output signals of FIG. 6 during a steady state load and a transient load.

FIG. 7 is a signal plot 700 depicting detail of the control signals and output signals of FIG. 6 during a steady state load and a transient load. The example signal plot 700 of FIG. 7 includes a first depiction 702, a second depiction 704, a third depiction 706, a fourth depiction 708, a fifth depiction 710, and a sixth depiction 712.

The first depiction 702 includes the first output current (line 614) and the second output current (line 616). The second depiction 704 includes the output voltage signal (line 618). The third depiction includes the first feed-forward voltage signal (line 620), the first ramp voltage signal (line 622), the first control voltage signal (line 624), and the first average feed-forward voltage signal (line 626). The fourth depiction 708 includes the first amplifier output voltage signal (line 628) and the first latch output voltage signal (line 630).

The fifth depiction 710 includes the second feed-forward voltage signal (line 632), the second ramp voltage signal (line 634), the second control voltage signal (line 636), and the second average feed-forward voltage signal (line 638). The sixth depiction 712 includes the second amplifier output voltage signal (line 640) and the second latch output voltage signal (line 642).

At a first example time interval 760 (e.g., the first time interval 660 of FIG. 6), the output node 208 is coupled to the load 203 in a steady state (i.e., there is not a transient load), and signals depicted in the signal plot 700 behave accordingly (e.g., in a manner similar to the examples illustrated in FIG. 5 and/or FIG. 6). In other words, because the load 203 is in a steady state, the first output current (line 614) and the second output current (line 616) are periodic inverse sawtooth waveforms centered at zero amperes, and the output voltage signal (line 618) is 980 millivolts. The first feed-forward voltage signal (line 620), the first control voltage signal (line 624), and the first average feed-forward voltage signal (line 626) remain at 1.1 volts. The first ramp voltage signal (line 622) is a periodic inverse sawtooth waveform centered at 1.1 volts.

Further, the second feed-forward voltage signal (line 632), the second control voltage signal (line 636), and the second average feed-forward voltage signal (line 638) remain at 0.99 volts. The second ramp voltage signal (line 634) is a periodic inverse sawtooth waveform centered at one volt.

Responsive to variations in the first feed-forward voltage signal (line 620), the first ramp voltage signal (line 622), the first control voltage signal (line 624), and the first average feed-forward voltage signal (line 626), the first amplifier output voltage signal (line 628) is a pulse with a maximum of five volts. The first latch output voltage signal (line 630) is a pulse at five volts. Similarly, responsive to variations in the second feed-forward voltage signal (line 632), the second ramp voltage signal (line 634), the second control voltage signal (line 636), and the second average feed-forward voltage signal (line 638), the second amplifier output voltage signal (line 640) is a pulse with a maximum of five volts. The second latch output voltage signal (line 642) is a pulse at five volts.

At a second example time interval 762, a transient load occurs at the output node 208 (e.g., a resistive load is coupled to the output node 208). The output voltage signal (line 618) responds and begins to decrease from 980 millivolts. The first feed-forward voltage signal (line 620) responds and increases to 1.4 volts, the first control voltage signal (line 624) responds and increases to 1.2 volts, the second feed-forward voltage signal (line 632) responds and increases to 1.3 volts, and the second control voltage signal (line 636) responds and increases to 1.2 volts. However, because the first average feed-forward voltage signal (line 626) is generated with a filter circuit including the fourth resistor 239, the fifth resistor 240, and the third capacitor 241, the first average feed-forward voltage signal (line 626) remains at 1.1 volts. Similarly, because the second average feed-forward voltage signal (line 638) is generated with a filter circuit including the seventh resistor 264, the eighth resistor 265, and the fifth capacitor 266, the second average feed-forward voltage signal (line 638) remains at 0.99 volts.

Unlike the steady state example of the first time interval 760, during the transient load at the second time interval 762, there is a difference in voltage between the first feed-forward voltage signal (line 620) and the first average feed-forward voltage signal (line 626). Therefore, the first comparator circuit 252 responds to a difference in voltage between the first ramp voltage signal (line 622) and the first control voltage signal (line 624) that is higher than the difference in voltage in the steady state example of FIG. 5. In other words, the voltage of the first ramp voltage signal (line 622) must be higher during a transient load to meet the condition described in Equation 5. As a result, the pulse widths of the first latch output voltage signal (line 630) during the transient load (e.g., a third pulse width 764) are wider than the pulse widths during a steady state load (e.g., the second pulse width 592 of FIG. 5). Responsive to the increase in pulse widths of the first latch output voltage signal (line 630), the first output current (line 614) increases to 6.5 amperes in order to regulate the output voltage signal (line 618).

Similar to the first comparator circuit 252, during the transient load of the second time interval 662, the second comparator circuit 273 responds to a difference in voltage between the second ramp voltage signal (line 634) and the second control voltage signal (line 636) that is higher than the difference in voltage in the steady state example of FIG. 5. In other words, the voltage of the second ramp voltage signal (line 634) must be higher during a transient load to meet the condition described in Equation 8. As a result, the pulse widths of the second latch output voltage signal (line 642) during the transient load (e.g., a fourth pulse width 766) are wider than the pulse widths (e.g., the fourth pulse width 596 of FIG. 5) during a steady state load. Responsive to the increase in pulse widths of the second latch output voltage signal (line 642), the second output current (line 616) increases to 6.5 amperes in order to regulate the output voltage signal (line 618).

As a result of the increase in the first output current (line 614) and the increase in the second output current (line 616), the decrease in voltage of the output voltage signal (line 618) slows and becomes 850 millivolts.

At a third example time interval 770, responsive to the increase in the first output current (line 614) and the increase in the second output current (line 616), the output voltage signal (line 618) normalizes to (e.g., remains at, settles to) 960 millivolts. Once the output voltage signal (line 618) has normalized, the first feed-forward voltage signal (line 620), the first ramp voltage signal (line 622), the first control voltage signal (line 624), the first average feed-forward voltage signal (line 626), the second feed-forward voltage signal (line 632), the second ramp voltage signal (line 634), the second control voltage signal (line 636), and the second average feed-forward voltage signal (line 638) begin to decrease. As a result, the pulse widths (e.g., the third pulse width 764 and the fourth pulse width 766) decrease and normalize to 0.1 microseconds. Responding to the decrease in pulse widths, the first output current (line 614) decreases to 5.5 amperes, and the second output current (line 616) decreases to 4.5 amperes. The output voltage signal (line 618) normalizes to 960 millivolts.

While an example manner of implementing the power conversion system 200 is illustrated in FIGS. 2, 3B, 4B, 5, 6, and/or 7, one or more of the elements, processes and/or devices illustrated in FIGS. 2, 3B, 4B, 5, 6, and/or 7 may be combined, divided, re-arranged, omitted, eliminated and/or implemented in any other way. Further, the example source voltage node 201, the example ground reference rail 202, the example load 203, the example controller 204, the example master stage 206, the example slave stage 207, the example ramp generator circuits 213A, 213B, the example latch circuits 216A, 216B, the example inductors 223A, 223B, the example capacitors 224A, 224B, the example power stage circuits 220A, 220B, the example inductors 223A, 223B, the example capacitors 224A, 224B, the example first resistor 225, the example second resistor 226, the example signal controller 228, the example first amplifier 234, the example second capacitor 235, the example second amplifier 236, the example third amplifier 237, the example third resistor 238, the example fourth resistor 239, the example fifth resistor 240, the example third capacitor 241, the example first comparator circuit 252, the example signal generator 260, the sixth example resistor 261, the fourth example capacitor 262, the fourth example amplifier 263, the seventh example resistor 264, the eighth example resistor 265, the fifth example capacitor 266, the example second comparator circuit 273, and/or, more generally, the example power conversion system 200 of FIG. 2 may be implemented by hardware, software, firmware and/or any combination of hardware, software and/or firmware. Thus, for example, any of the example source voltage node 201, the example ground reference rail 202, the example load 203, the example controller 204, the example master stage 206, the example slave stage 207, the example ramp generator circuits 213A, 213B, the example latch circuits 216A, 216B, the example inductors 223A, 223B, the example capacitors 224A, 224B, the example power stage circuits 220A, 220B, the example inductors 223A, 223B, the example capacitors 224A, 224B, the example first resistor 225, the example second resistor 226, the example signal controller 228, the example first amplifier 234, the example second capacitor 235, the example second amplifier 236, the example third amplifier 237, the example third resistor 238, the example fourth resistor 239, the example fifth resistor 240, the example third capacitor 241, the example first comparator circuit 252, the example signal generator 260, the sixth example resistor 261, the fourth example capacitor 262, the fourth example amplifier 263, the seventh example resistor 264, the eighth example resistor 265, the fifth example capacitor 266, the example second comparator circuit 273, and/or, more generally, the example power conversion system 200 of FIG. 2 could be implemented by one or more analog or digital circuits, logic circuits, programmable processors, programmable controllers, graphics processing units (GPUs), digital signal processors (DSPs), application specific integrated circuits (ASICs), programmable logic devices (PLDs) and/or field programmable logic devices (FPLDs).

When reading any of the apparatus or system claims of this patent to cover a purely software and/or firmware implementation, at least one of the example controller 204, the example master stage 206, the example slave stage 207, the example ramp generator circuits 213A, 213B, the example latch circuits 216A, 216B, the example power stage circuits 220A, 220B, the example signal controller 228, the example first amplifier 234, the example second amplifier 236, the example third amplifier 237, the example first comparator circuit 252, the example signal generator 260, the fourth example amplifier 263, and the example second comparator circuit 273 is/are hereby expressly defined to include a non-transitory computer readable storage device or storage disk such as a memory, a digital versatile disk (DVD), a compact disk (CD), a Blu-ray disk, etc. including the software and/or firmware.

Further still, the example power conversion system 200 of FIG. 2 may include one or more elements, processes and/or devices in addition to, or instead of, those illustrated in FIGS. 2, 3B, 4B, 5, 6, and/or 7 may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 8:
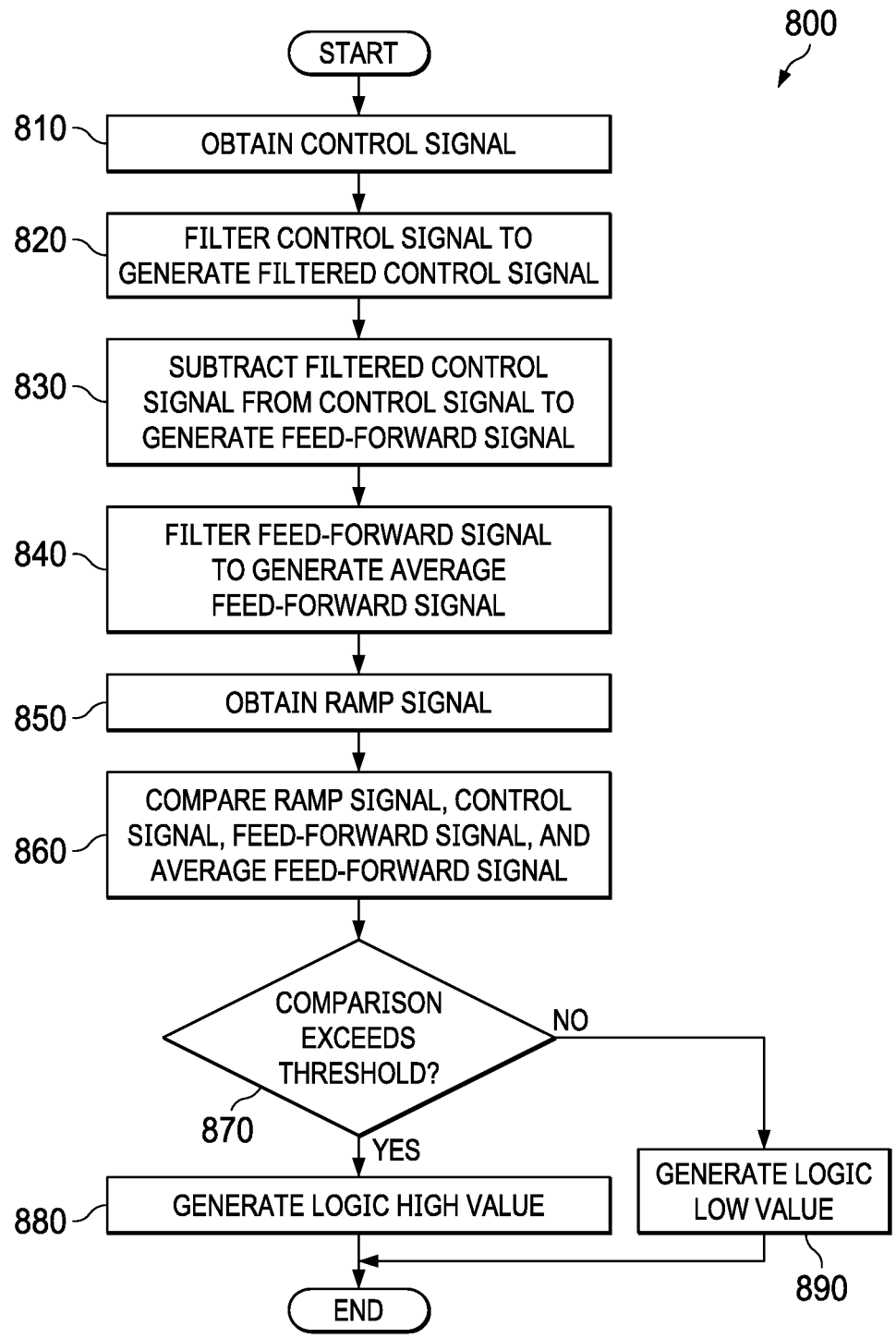
FIG. 8 is a flowchart representative of a process that may be implemented using logic or machine readable instructions that may be executed to implement an example power conversion system.

A flowchart representative of example hardware logic, machine readable instructions, hardware implemented state machines, and/or any combination thereof for implementing the power conversion system 200 of FIG. 2 is shown in FIG. 8. The machine readable instructions may be an executable program or portion of an executable program for execution by one or more computer processors, one or more microcontrollers, etc. For example, the machine readable instructions may be executed by one or more integrated circuits, logic circuits, microprocessors, GPUs, DSPs, or controllers from any desired family or manufacturer. For example, the one or more integrated circuits, logic circuits, microprocessors, GPUs, DSPs, or controllers may be semiconductor based (e.g., silicon based) devices. The program may be embodied in software stored on a non-transitory computer readable storage medium such as non-volatile memory, volatile memory, etc., associated with the one or more computer processors, the one or more microcontrollers, etc., but the entire program and/or parts thereof could alternatively be executed by a device other than the one or more computer processors, the one or more microcontrollers, etc., and/or embodied in firmware or dedicated hardware. Further, although the example program is described with reference to the flowchart illustrated in FIG. 8, many other methods of implementing the example power conversion system 200 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding programs can be executed in whole or in part. Thus, the disclosed machine readable instructions and/or corresponding programs are intended to encompass such machine readable instructions and/or programs regardless of the particular format or state of the machine readable instructions and/or programs when stored or otherwise at rest or in transit.

The machine readable instructions described herein can be represented by any past, present, or future instruction language, scripting language, programming language, etc. For example, the machine readable instructions may be represented using any of the following languages: C, C++, Java, C #, Perl, Python, JavaScript, HyperText Markup Language (HTML), Structured Query Language (SQL), Swift, etc.

As mentioned above, the example processes of FIG. 8 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a," "an," "first," "second," etc.) do not exclude a plurality. The term "a" or "an" entity, as used herein, refers to one or more of that entity. The terms "a" (or "an"), "one or more," and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 8 is a flowchart representative of a process 800 that may be implemented using logic or machine readable instructions that may be executed to implement an example power conversion system (e.g., the slave stage 207 of FIG. 2). In the example process 800 of FIG. 8, the example slave stage 207 is configured to obtain a control signal (such as a signal configured to be obtained at the input terminal 259, a signal generated by the master stage 206, and/or the signal VCONTROL). (Block 810). The signal generator 260 (e.g., the sixth resistor 261 and the fourth capacitor 262) filters the control signal to generate a filtered control signal (e.g., a signal at the non-inverting input of the fourth amplifier 263). (Block 820). In some examples, the filtered control signal may be generated via a low pass filter circuit. However, any other methods to generate the filtered control signal may additionally or alternatively be used. The signal generator 260 (e.g., the fourth amplifier 263 and the seventh resistor 264) subtracts the filtered control signal from the control signal to generate a feed-forward signal (e.g., the signal VTFF_s). (Block 830). The signal generator 260 (e.g., the eighth resistor 265 and the fifth capacitor 266) filters the feed-forward signal to generate an average feed-forward signal (e.g., the signal VTFFAVG_s). (Block 840). In some examples, the average feed-forward signal may be generated via a low pass filter circuit. However, any other methods to generate the average feed-forward signal may additionally or alternatively be used.

The second comparator circuit 273 obtains and/or is configured to obtain a ramp signal (e.g., the signal VRAMP_s generated by the ramp generator circuit 213B). (Block 850). The second comparator circuit 273 compares the ramp signal, the control signal, the feed-forward signal, and the average feed-forward signal to a threshold, as described above in Equation 8. (Block 860). Any number of signals may be compared by the second comparator circuit 273. For example, the second comparator circuit 273 may compare the control signal, the feed-forward signal, and the average feed-forward signal to a threshold, or the second comparator circuit 273 may compare six signals to a threshold.

If the second comparator circuit 273 determines that the comparison exceeds a threshold (e.g., the control of block 870 returns a result of YES), the second comparator circuit 273 generates an amplifier output signal corresponding to a logic high value, and the process 800 stops. (Block 880). If the second comparator circuit 273 determines that the comparison does not exceed a threshold (e.g., the control of block 870 returns a result of NO), the second comparator circuit 273 generates an amplifier output signal corresponding to a logic low value, and the process 800 stops. (Block 890). The amplifier output signal (e.g., a logic high value or a logic low value) may be a pulse. In some examples, the second comparator circuit 273 may generate an amplifier output signal responsive to the comparison exceeding the threshold and wait until the comparison no longer exceeds the threshold. In other examples, the second comparator circuit 273 may generate a logic high value responsive to the comparison meeting the threshold. In further examples, the second comparator circuit 273 may generate a logic low value in response to the comparison exceeding a threshold and generate a logic high value in response to the comparison not exceeding a threshold.

Example methods, apparatus, and systems to adjust transient response in a multistage system are disclosed herein. Further examples and combinations thereof include the following:

Example 1 includes an apparatus comprising a first filter circuit including an input configured to be coupled to an output of a master stage and an output, an amplifier circuit including a first input, a second input, and an output, the first input of the amplifier circuit coupled to the input of the first filter circuit, the second input of the amplifier circuit coupled to the output of the first filter circuit, a second filter circuit including an input and an output, the input of the second filter circuit coupled to the output of the amplifier circuit, and a comparator circuit including a first input, a second input, a third input, and an output, the first input of the comparator circuit coupled to the input of the first filter circuit, the second input of the comparator circuit coupled to the output of the amplifier circuit, the third input of the comparator circuit coupled to the output of the second filter circuit, and the output of the comparator circuit adapted to be coupled to a latch circuit.

Example 2 includes the apparatus of example 1, wherein the comparator circuit is to, in response to a comparison of the first, second, and third inputs to the comparator circuit, and a threshold, reset the latch circuit.

Example 3 includes the apparatus of example 1, wherein the apparatus further includes a ramp generator circuit including an output, and wherein the comparator circuit further includes a fourth input coupled to the output of the ramp generator circuit.

Example 4 includes the apparatus of example 3, wherein the latch circuit includes an output, the apparatus further including a power stage circuit including an input coupled the output of the latch circuit, and wherein the power stage circuit is adapted to amplify a PWM signal provided by the latch circuit.

Example 5 includes the apparatus of example 4, wherein the power stage circuit includes an output adapted to be coupled to a low pass filter circuit.

Example 6 includes the apparatus of example 1, wherein the comparator circuit includes a dual differential amplifier.

Example 7 includes the apparatus of example 1, wherein the amplifier circuit includes a transconductance amplifier.

Example 8 includes the apparatus of example 1, wherein the first filter circuit includes a low pass filter circuit.

Example 9 includes an apparatus comprising a first power stage to provide power to a load and to provide a control signal, the control signal to vary an output signal provided by a second power stage, and the second power stage to provide power to the load, the second power stage including a first filter circuit configured to obtain the control signal and generate a filtered control signal, an amplifier to receive the control signal and the filtered control signal, the amplifier to generate a feed-forward signal based on the control signal, a second filter circuit to obtain the feed-forward signal and generate an average feed-forward signal based on an average of the feed-forward signal over a period of time, and a comparator circuit to obtain the control signal, the feed-forward signal, and the average feed-forward signal, wherein the comparator circuit is further to output an amplifier signal in response to a comparison of the control signal, the feed-forward signal, the average feed-forward signal, and a threshold.

Example 10 includes the apparatus of example 9, the second stage further includes a ramp generator to provide a ramp signal, and the comparator circuit is to output the amplifier signal in response to a comparison of the control signal, the feed-forward signal, the average feed-forward signal, the ramp signal, and the threshold.

Example 11 includes the apparatus of example 9, wherein the second stage further includes a latch circuit to obtain the amplifier signal and generate a latch signal.

Example 12 includes a system comprising a first stage including an input terminal adapted to be coupled to a controller and an output terminal, and a second stage including an input terminal coupled to the output terminal of the first stage, a first filter circuit including an input terminal coupled to the input terminal of the second stage and an output terminal, an amplifier circuit including a first input terminal coupled to the input terminal of the second stage, a second input terminal coupled to the output terminal of the first filter circuit, and an output terminal, and a second filter circuit including an input terminal coupled to the output terminal of the amplifier circuit and an output terminal.

Example 13 includes the system of example 12, wherein the amplifier circuit includes a transconductance amplifier.

Example 14 includes the system of example 12, wherein the input terminal of the first stage is a first input terminal, and the first stage includes a second input terminal adapted to be coupled to a first resistor and a second resistor.

Example 15 includes the system of example 12, wherein the second stage further includes an comparator circuit including a first input coupled to the input terminal of the second stage, a second input coupled to the output terminal of the amplifier circuit, a third input coupled to the output terminal of the second filter circuit, and an output coupled to a latch circuit.

Example 16 includes the system of example 15, wherein the latch circuit further includes an output terminal, the second stage further includes a power stage circuit including an input terminal coupled to the output terminal of the latch circuit, and the power stage circuit is adapted to amplify a latch signal generated by the latch circuit.

Example 17 includes the system of example 16, wherein the power stage circuit includes an output terminal adapted to be coupled to a low pass filter circuit, the low pass filter circuit adapted to supply a filtered power signal to a load.

Example 18 includes the system of example 15, wherein the comparator circuit is to, in response to a comparison of the first input, the second input, the third input, and a threshold, reset the latch circuit.

Example 19 includes the system of example 15, wherein the second stage further includes a ramp generator circuit including an output terminal to generate a ramp signal, the comparator circuit further includes a fourth input coupled to the output terminal of the ramp generator circuit, and the comparator circuit is to reset the latch circuit in response to a comparison of the first input, the second input, the third input, the fourth input, and a threshold.

Example 20 includes the system of example 15, wherein the comparator circuit includes a dual differential amplifier.

From the foregoing, it will be appreciated that example methods, apparatus, and systems have been disclosed that adjust transient response in a multistage system. The disclosed methods, apparatus and articles of manufacture improve the efficiency of using a computing device by allowing stages in the multistage system to respond to a sudden transient load. Stages may obtain, filter, and/or amplify a control signal generated by a master stage to generate signals (e.g., a feed-forward signal, an average feed-forward signal). As a result, the stages in the multistage system may include similar load transient responses, and the output signal of the multistage system is regulated by each stage. The disclosed methods, apparatus and articles of manufacture are accordingly directed to one or more improvements in the functioning of a multistage system.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus comprising:
   a first filter circuit including an input configured to be coupled to an output of a master stage and an output;
   an amplifier circuit including a first input, a second input, and an output, the first input of the amplifier circuit coupled to the input of the first filter circuit, the second input of the amplifier circuit coupled to the output of the first filter circuit;
   a second filter circuit including an input and an output, the input of the second filter circuit coupled to the output of the amplifier circuit; and
   a comparator circuit including a first input, a second input, a third input, and an output, the first input of the comparator circuit coupled to the input of the first filter circuit, the second input of the comparator circuit coupled to the output of the amplifier circuit, the third input of the comparator circuit coupled to the output of the second filter circuit, and the output of the comparator circuit adapted to be coupled to a latch circuit.

2. The apparatus of claim 1, wherein the comparator circuit is to, in response to a comparison of the first, second, and third inputs to the comparator circuit, and a threshold, reset the latch circuit.

3. The apparatus of claim 1, wherein the apparatus further includes a ramp generator circuit including an output, and wherein the comparator circuit further includes a fourth input coupled to the output of the ramp generator circuit.

4. The apparatus of claim 3, wherein the latch circuit includes an output, the apparatus further including a power stage circuit including an input coupled the output of the latch circuit, and wherein the power stage circuit is adapted to amplify a PWM signal provided by the latch circuit.

5. The apparatus of claim 4, wherein the power stage circuit includes an output adapted to be coupled to a low pass filter circuit.

6. The apparatus of claim 1, wherein the comparator circuit includes a dual differential amplifier.

7. The apparatus of claim 1, wherein the amplifier circuit includes a transconductance amplifier.

8. The apparatus of claim 1, wherein the first filter circuit includes a low pass filter circuit.

9. An apparatus comprising:
   a first power stage to provide power to a load and to provide a control signal, the control signal to vary an output signal provided by a second power stage; and
   the second power stage to provide power to the load, the second power stage including:
      a first filter circuit configured to obtain the control signal and generate a filtered control signal;
      an amplifier to receive the control signal and the filtered control signal, the amplifier to generate a feed-forward signal based on the control signal;
      a second filter circuit to obtain the feed-forward signal and generate an average feed-forward signal based on an average of the feed-forward signal over a period of time; and
      a comparator circuit to obtain the control signal, the feed-forward signal, and the average feed-forward signal, wherein the comparator circuit is further to output an amplifier signal in response to a comparison of the control signal, the feed-forward signal; and the average feed-forward signal to a threshold.

10. The apparatus of claim 9, the second stage further includes a ramp generator to provide a ramp signal, and the comparator circuit is to output the amplifier signal in response to a comparison of the control signal, the feed-forward signal, the average feed-forward signal, the ramp signal, and the threshold.

11. The apparatus of claim 9, wherein the second stage further includes a latch circuit to obtain the amplifier signal and generate a latch signal.

12. A system comprising:
   a first stage including an input terminal adapted to be coupled to a controller and an output terminal, the first stage including a comparator having a comparator input connected to the output terminal; and
   a second stage including:
      an input terminal coupled to the output terminal of the first stage;
      a first filter circuit including an input terminal coupled to the input terminal of the second stage and an output terminal;
      an amplifier circuit including a first input terminal coupled to the input terminal of the second stage, a second input terminal coupled to the output terminal of the first filter circuit, and an output terminal; and
      a second filter circuit including an input terminal coupled to the output terminal of the amplifier circuit and an output terminal.

13. The system of claim 12, wherein the amplifier circuit includes a transconductance amplifier.

14. The system of claim 12, wherein the input terminal of the first stage is a first input terminal, and the first stage includes a second input terminal adapted to be coupled to a first resistor and a second resistor.

15. A system comprising:
- a first stage including an input terminal adapted to be coupled to a controller and an output terminal; and
- a second stage including:
  - an input terminal coupled to the output terminal of the first stage;
  - a first filter circuit including an input terminal coupled to the input terminal of the second stage and an output terminal;
  - an amplifier circuit including a first input terminal coupled to the input terminal of the second stage, a second input terminal coupled to the output terminal of the first filter circuit, and an output terminal;
  - a second filter circuit including an input terminal coupled to the output terminal of the amplifier circuit and an output terminal; and
  - comparator circuit including a first input coupled to the input terminal of the second stage, a second input coupled to the output terminal of the amplifier circuit, a third input coupled to the output terminal of the second filter circuit, and an output coupled to a latch circuit.

16. The system of claim 15, wherein the latch circuit further includes an output terminal, the second stage further includes a power stage circuit including an input terminal coupled to the output terminal of the latch circuit, and the power stage circuit is adapted to amplify a latch signal generated by the latch circuit.

17. The system of claim 16, wherein the power stage circuit includes an output terminal adapted to be coupled to a low pass filter circuit, the low pass filter circuit adapted to supply a filtered power signal to a load.

18. The system of claim 15, wherein the comparator circuit is to, in response to a comparison of the first input, the second input, the third input, and a threshold, reset the latch circuit.

19. The system of claim 15, wherein the second stage further includes a ramp generator circuit including an output terminal to generate a ramp signal, the comparator circuit further includes a fourth input coupled to the output terminal of the ramp generator circuit, and the comparator circuit is to reset the latch circuit in response to a comparison of the first input, the second input, the third input, the fourth input, and a threshold.

20. The system of claim 15, wherein the comparator circuit includes a dual differential amplifier.

* * * * *